(12) United States Patent
Yoon et al.

(10) Patent No.: US 11,594,155 B2
(45) Date of Patent: Feb. 28, 2023

(54) DISPLAY DEVICE AND ELECTRONIC APPARATUS HAVING THE SAME

(71) Applicant: SAMSUNG DISPLAY CO., LTD., Yongin-si (KR)

(72) Inventors: Hyoyul Yoon, Seoul (KR); Kyoungah Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/071,129

(22) Filed: Oct. 15, 2020

(65) Prior Publication Data
US 2021/0150944 A1    May 20, 2021

(30) Foreign Application Priority Data
Nov. 14, 2019  (KR) .................. 10-2019-0145874

(51) Int. Cl.
| | | |
|---|---|---|
| *H05K 5/00* | (2006.01) | |
| *G09F 9/30* | (2006.01) | |
| *G06F 1/16* | (2006.01) | |
| *H05K 1/02* | (2006.01) | |
| *H05K 1/18* | (2006.01) | |

(52) U.S. Cl.
CPC ............ *G09F 9/301* (2013.01); *G06F 1/1616* (2013.01); *H05K 1/028* (2013.01); *H05K 1/189* (2013.01); *H05K 2201/10128* (2013.01)

(58) Field of Classification Search
CPC ....... G09F 9/301; G06F 1/1616; H05K 1/028; H05K 1/189; H05K 2201/10128
USPC ..... 361/679.01, 679.02, 679.27, 749; 349/58
See application file for complete search history.

(56) References Cited

U.S. PATENT DOCUMENTS

| | | |
|---|---|---|
| 10,013,028 B2 | 7/2018 | Ahn |
| 10,191,518 B2 | 1/2019 | Jang et al. |
| 10,569,501 B2 | 2/2020 | Lim et al. |
| 2016/0181345 A1* | 6/2016 | Lee .................. H05K 1/028 257/40 |
| 2016/0275830 A1* | 9/2016 | You ............... G02F 1/133305 |
| 2017/0060188 A1* | 3/2017 | Han .................. G06F 1/1641 |

(Continued)

FOREIGN PATENT DOCUMENTS

| | | |
|---|---|---|
| CN | 109377887 | 2/2019 |
| KR | 10-2015-0000756 | 1/2015 |

(Continued)

OTHER PUBLICATIONS

European Search Report dated Apr. 8, 2021 in corresponding European Application No. 20207198.1 (9 pages).

*Primary Examiner* — Binh B Tran
(74) *Attorney, Agent, or Firm* — F. Chau & Associates, LLC

(57) ABSTRACT

The present disclosure relates to a display device. The display device includes a display module and a support plate. The display module includes a display panel to display an image. The display module has a folding area folded with respect to a folding axis and a plurality of non-folding area adjacent to both sides of the folding area are defined on a plane. Additionally, the display module may include a plurality of layers disposed above and below the display panel. The support plate is disposed on a rear surface of the display module. An extension part of at least one layer of the plurality of layers may be coupled to the support plate.

28 Claims, 31 Drawing Sheets

(56) References Cited

U.S. PATENT DOCUMENTS

| | | |
|---|---|---|
| 2017/0357289 A1 | 12/2017 | Ahn |
| 2018/0150102 A1 | 5/2018 | Lee et al. |
| 2018/0150106 A1 | 5/2018 | Jang et al. |
| 2018/0192527 A1 | 7/2018 | Yun et al. |
| 2019/0339741 A1 | 11/2019 | Park |

FOREIGN PATENT DOCUMENTS

| | | |
|---|---|---|
| KR | 10-2017-0070917 | 6/2017 |
| KR | 10-2017-0139740 | 12/2017 |
| KR | 10-2018-0058283 | 6/2018 |
| KR | 10-2018-0062273 | 6/2018 |
| KR | 10-2018-0062275 | 6/2018 |
| KR | 10-2018-0068382 | 6/2018 |

* cited by examiner

DISPLAY DEVICE AND ELECTRONIC APPARATUS HAVING THE SAME

CROSS-REFERENCE TO RELATED APPLICATIONS

This U.S. non-provisional patent application claims priority under 35 U.S.C. § 119 of Korean Patent Application No. 10-2019-0145874, filed on Nov. 14, 2019, the contents of which are incorporated by reference herein in its entirety.

BACKGROUND

The present disclosure relates to a display device and an electronic apparatus, and more particularly, to a foldable display device and an electronic apparatus having the same.

Display devices are used in electronic devices such as mobile phones, televisions, tablets, and computers. Mobile phones and other electronic devices including a display device may be designed for convenient daily use by a user. For example, images may be exhibited on display device to convey information such as weather, sports, or news. The demand for large display devices increases as people increasingly choose larger mobile phones and other electronic devices.

Foldable or bendable mobile devices can provide a large display in a relatively small package. For example, the folding feature may allow the user to halve the length of the phone for easy storage when not in use. However, in some cases when the mobile phone is unfolded, the folding area may tend to bend slightly. This may create a crease in the display when in use. The crease can be unsightly and may be effect usability of the device. Therefore, there is a need in the art to reduce the bending forces that occur when a foldable electronic device is unfolded.

SUMMARY

The present disclosure provides a display device that reduces bending deformation in a folding area to increase reliability and an electronic apparatus.

An embodiment of the inventive concept provides a display device including a display module comprising a display panel on which a folding area configured to fold with respect to a folding axis and a plurality of non-folding areas adjacent to two opposite sides of the folding area are defined on a plane, and wherein the display module comprises a plurality of layers disposed above or below the display panel; and a support plate disposed on a rear surface of the display module, wherein an extension part of at least one layer of the plurality of layers is coupled to the support plate.

The support plate is disposed on a rear surface of the display module. An extension part of at least one layer of the plurality of layers may be coupled to the support plate.

In an embodiment of the inventive concept, a display device includes a display panel which displays an image and on which a folding area folded with respect to a folding axis and a plurality of non-folding area adjacent to both sides of the folding area are defined on a plane, a window disposed above the display panel, a base layer disposed below the display panel, and a support plate disposed below the base layer.

The display panel includes a panel body part and a panel extension part extending from the panel body part and bent from the panel body part so as to be coupled to a rear surface of the support plate.

In an embodiment of the inventive concept, an electronic apparatus includes a display panel which displays an image and on which a folding area folded with respect to a folding axis and a plurality of non-folding area adjacent to both sides of the folding area are defined on a plane; a window disposed above the display panel; a base layer disposed below the display panel; and a support plate disposed below the base layer, wherein the display panel comprises a panel body part; and a panel extension part extending from the panel body part and curved from the panel body part so as to be coupled to a rear surface of the support plate. An extension part of at least one layer of the plurality of layers may be coupled to the case.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
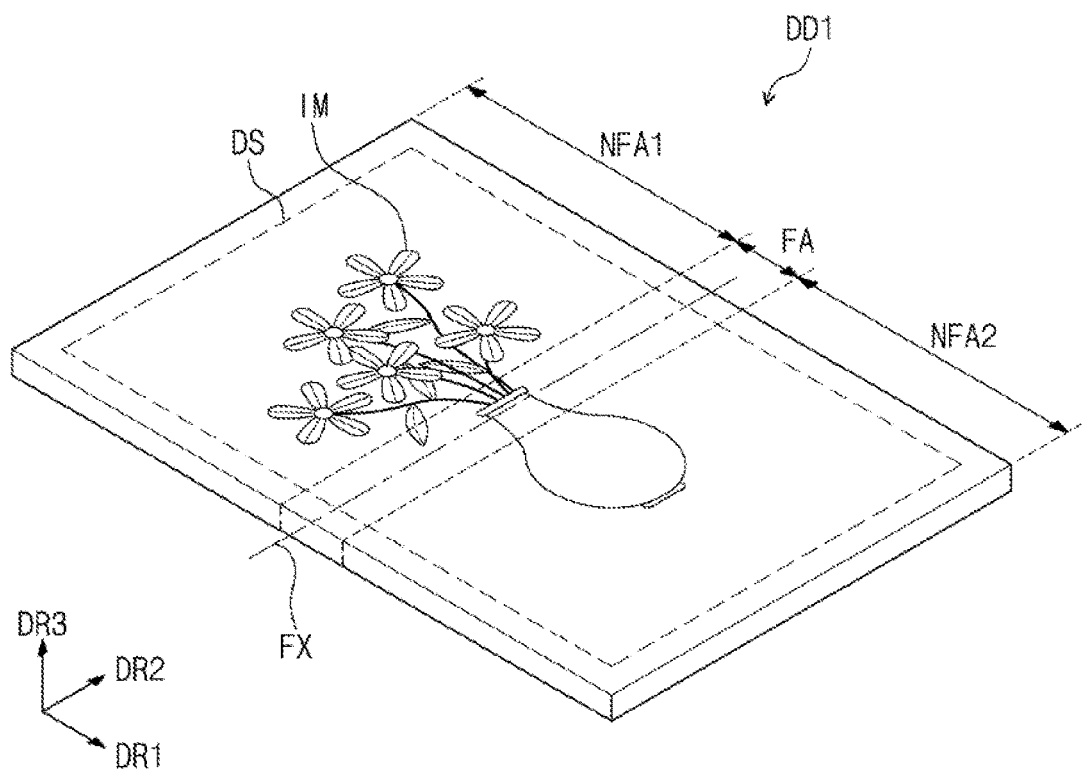
FIG. 1A is a perspective view of a display device according to an embodiment of the inventive concept.

The present disclosure relates generally to a display device, and more specifically, to a foldable, bendable, or rollable display device. The display device may include a display panel to display an image. The display module may have a folding area folded with respect to a folding axis and a plurality of non-folding area adjacent to both sides of the folding area are defined on a plane. Additionally, the display module may include a plurality of layers disposed above and below the display panel. The support plate may be disposed on a rear surface of the display module. An extension part of at least one layer of the plurality of layers may be coupled to the support plate.

Embodiments of the present disclosure constrain an edge portion of the display module to a metal plate to reduce the bending deformation during the un-folding state. An upper layer disposed on a display panel may be constrained to the metal plate. The bending or folding area of the display panel may be fixed to the metal plate. The lower layer disposed below the display panel may be constrained to the metal plate. As a result, the display device may reduce the degree of deformation at the bending or folding area.

In the present disclosure, it will be understood that when one component (or region, layer, portion) is referred to as being 'on', 'connected to', or 'coupled to' another component, it can be directly disposed/connected/coupled on/to the other component, or an intervening third component may be present.

Like reference numerals refer to like elements throughout. Additionally, in the figures, the thickness, ratio, and dimensions of components are exaggerated for clarity of illustration. The term "and/or" includes any and all combinations of one or more of the associated listed items.

It will be understood that although the terms such as 'first' and 'second' are used herein to describe various elements, these elements should not be limited by these terms. The terms are used to distinguish one component from other components. For example, a first element referred to as a first element in one embodiment can be referred to as a second element in another embodiment without departing from the scope of the appended claims. The terms of a singular form may include plural forms unless referred to the contrary.

Additionally, "under", "below", "above", "upper", and the like are used for explaining relation association of components illustrated in the drawings. The terms may be a relative concept and described based on directions expressed in the drawings.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, exemplary embodiments of the inventive concept will be described with reference to the accompanying drawings.

Figure 1B:
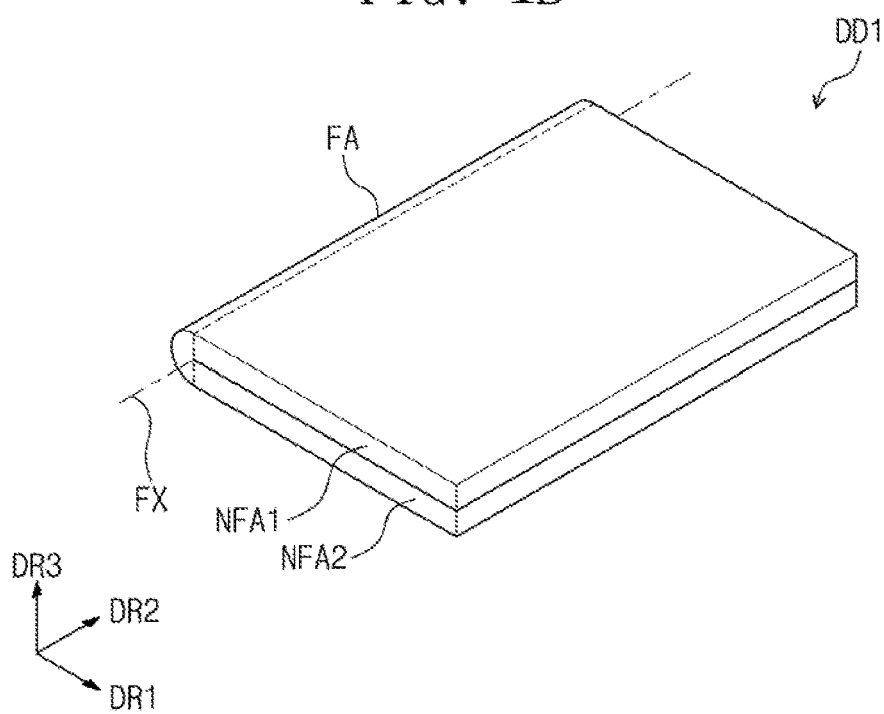
FIG. 1B is a perspective view illustrating an in-folded state of the display device according to an embodiment of the inventive concept.

FIG. 1A is a perspective view of a display device according to an embodiment of the inventive concept. FIG. 1B is a perspective view illustrating an in-folded state of the display device according to an embodiment of the inventive concept, and FIG. 1C is a perspective view illustrating an out-folded state of the display device according to an embodiment of the inventive concept.

Figure 1C:
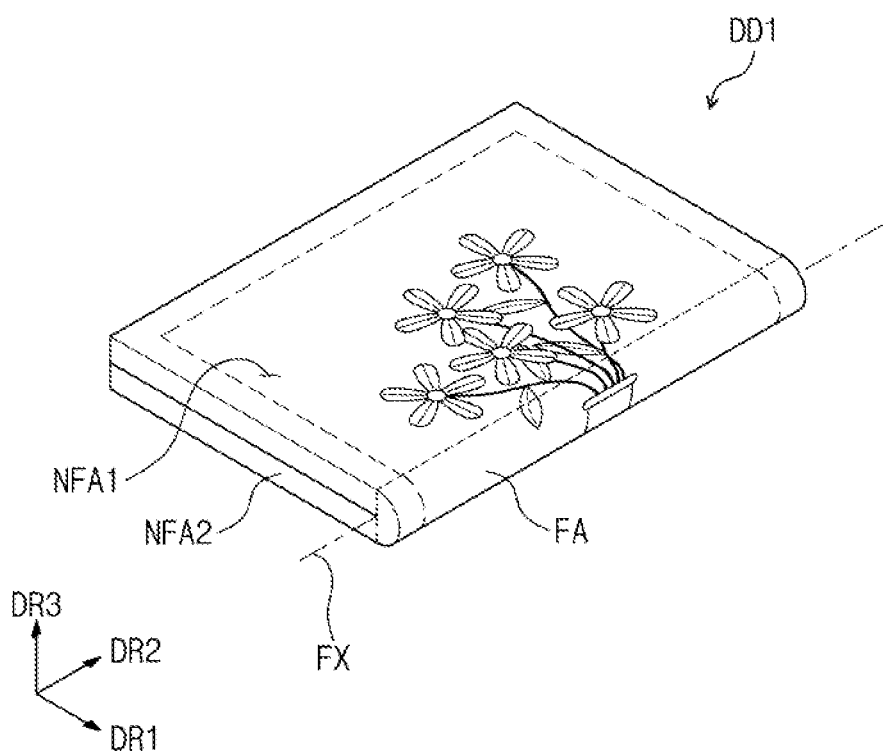
FIG. 1C is a perspective view illustrating an out-folded state of the display device according to an embodiment of the inventive concept.

As illustrated in FIGS. 1A to 1C, a display device DD1 includes a first area and a second area. The first area may include a folding area FA, and the second area may include a plurality of non-folding areas. The second area may include first and second non-folding areas NFA1 and NFA2. The folding area FA may be disposed between the first and second non-folding areas NFA1 and NFA2. The display device DD1 illustrated in FIGS. 1A to 1C is merely one example, and the display device DD1 may include two or more folding areas FA.

A folding axis FX is defined on the folding area FA. The folding axis FX may be a rotational axis generated when the display device DD1 is folded. Additionally, the folding axis FX may be defined by a mechanical structure of the display device DD1.

The display device DD1 includes a display surface DS on which an image IM is displayed. The display surface DS may be divided into a display surface of the first non-folding area NFA1, a display surface of the second non-folding area NFA2, and a display surface of the folding area FA. Hereinafter, a first direction DR1 and a second direction DR2 define the display surface DS in an unfolded state. A third direction DR3 indicates a thickness direction of the display device DD1. Additionally, the second direction DR2 indicates an extension direction of the folding axis FX.

As illustrated in FIG. 1B, the display device DD1 is folded along the folding axis FX so the display surface of the first non-folding area NFA1 and the display surface of the second non-folding area NFA2 face each other. Hereinafter, the folding of the display surfaces of the different non-folding areas facing each other is referred to as in-folding. In an embodiment, the display device DD1 may be in-folded when the first non-folding area NFA1 rotates in a clockwise direction along the folding axis FX. The folding axis FX may be defined at a center of the display device DD1 in the first direction DR1 to in-fold the display device DD1 so the first non-folding area NFA1 and the second non-folding area NFA2 are aligned.

As illustrated in FIG. 1C, in an embodiment of the inventive concept, the display device DD1 is folded along the folding axis FX so the display surface of the first non-folding area NFA1 and the display surface of the second non-folding area NFA2 face the outside. Hereinafter, the outward folding of the display surfaces of the different non-folding areas NFA1 and NFA2 is referred to as out-folding.

The display device DD1 may display the image IM when the display surface of the first non-folding area NFA1 and the display surface of the second non-folding area NFA2 are exposed to the outside. Additionally, the display surface of the folding area FA exposed to the outside may display the image IM. As illustrated in FIG. 1A, the display device DDI may display the image IM in the unfolded state. The first non-folding area NFA1, the second non-folding area NFA2, and the folding area FA may respectively display images providing information independent of each other or respectively display portions of one image providing one information.

Figure 2A:
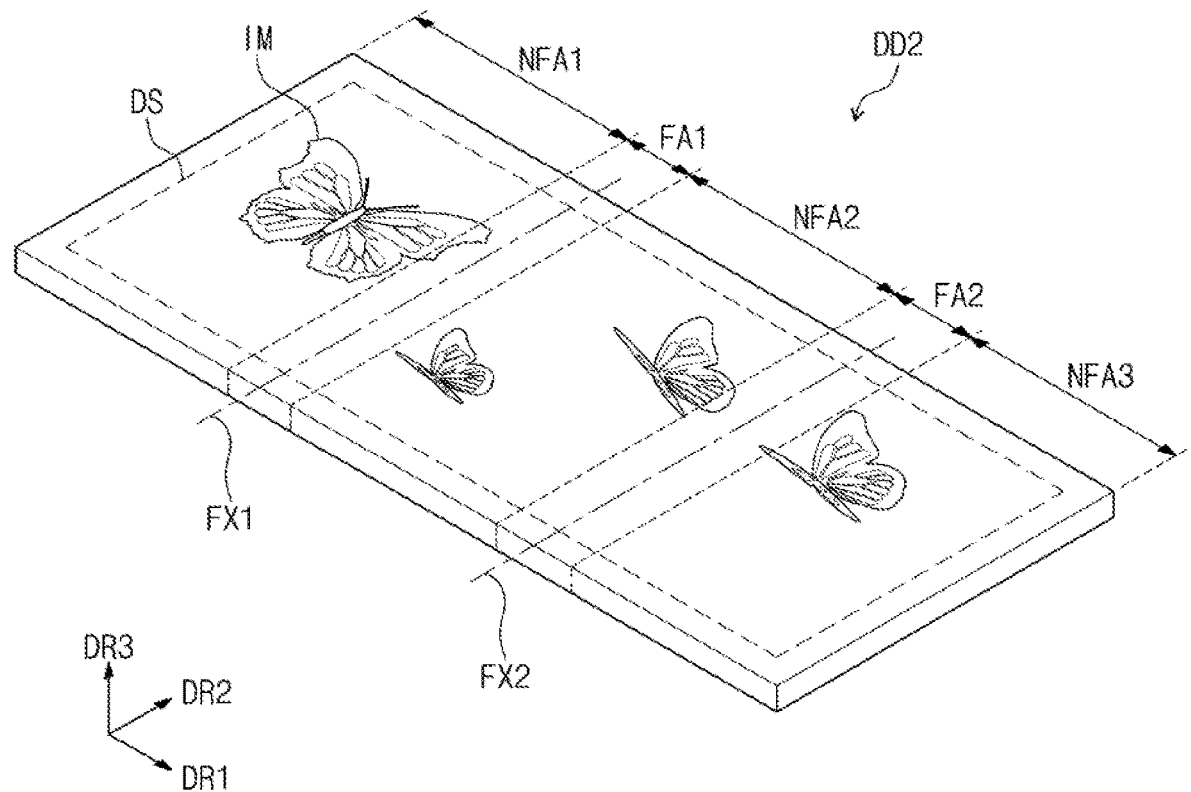
FIG. 2A is a perspective view of a display device according to an embodiment of the inventive concept.
Figure 2B:
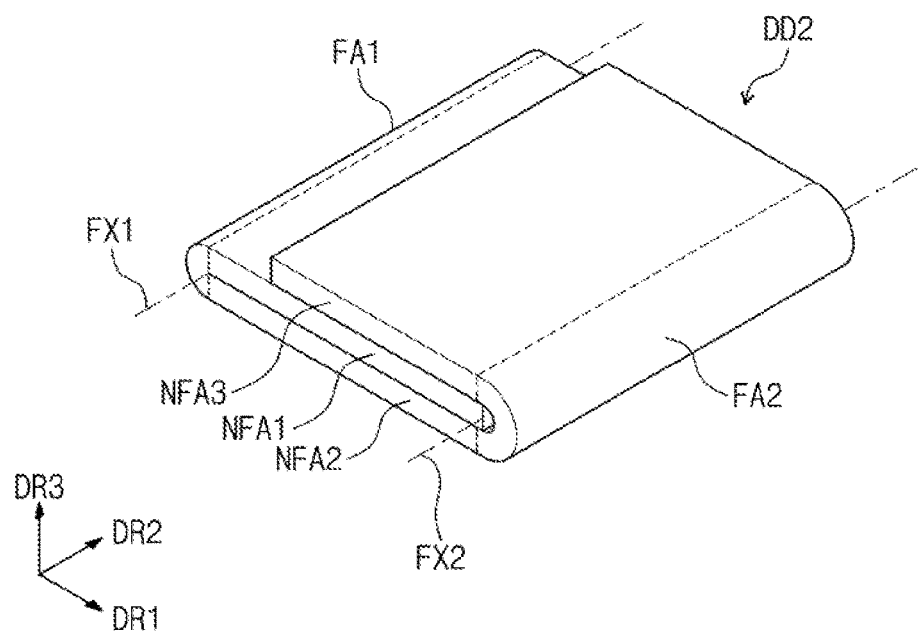
FIG. 2B is a perspective view illustrating a folded state of the display device according to an embodiment of the inventive concept.
Figure 2C:
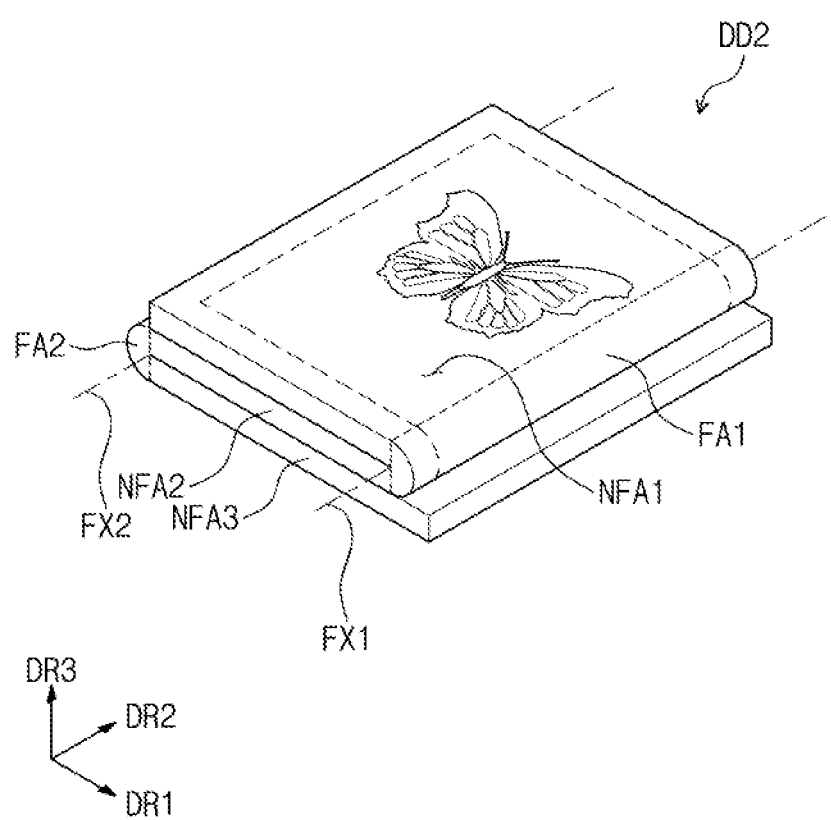
FIG. 2C is a perspective view illustrating a folded state of the display device according to an embodiment of the inventive concept.

FIG. 2A is a perspective view of a display device according to an embodiment of the inventive concept. FIG. 2B is a perspective view illustrating a folded state of the display device according to an embodiment of the inventive concept, and FIG. 2C is a perspective view illustrating a folded state of the display device according to an embodiment of the inventive concept.

Referring to FIGS. 2A and 2B, a display device DD2, according to an embodiment of the inventive concept, may include a plurality of folding areas FAT and FA2. In this embodiment, the display device DD2 including the two folding areas FAT and FA2 is illustrated as an example.

The display device DD2 includes first to third non-folding areas NFA1, NFA2, and NFA3, and first and second folding areas FA1 and FA2. In the unfolded state of the display device DD2, the first folding area FA1 is disposed between the first non-folding area NFA1 and the second non-folding area NFA2. Additionally, the second folding area FA2 is disposed between the second non-folding area NFA2 and the third non-folding area NFA3. According to the folding method, widths of the first and second folding areas FA1 and FA2 may be the same or different from each other.

First and second folding axes FX1 and FX2 may be defined on the first and second folding areas FA1 and FA2, respectively. The display device DD2 may be in-folded or out-folded along the first folding axis FX1 and the second folding axis FX2.

As illustrated in FIG. 2B, the display device DD2 may be in-folded on the first folding area FA1 along the first folding axis FX1. The display device DD2 may be in-folded on the second folding area FA2 along the second folding axis FX2.

As illustrated in FIG. 2C, the display device DD2 may be out-folded on the first folding area FA1 along the first folding axis FX1. The display device DD2 may be in-folded on the second folding area FA2 along the second folding axis FX2. The display device DD2 may be out-folded on the first folding area FA1 so the display surface DS is exposed to the outside. The display device DD2 may be in-folded on the second folding area FA2 so the display surface of the second non-folding area NFA2 and the display surface of the third non-folding area NFA3 face each other. In this case, the display device DD2 in the folded state may display an image IM to the outside through the first non-folding area NFA1. The display device DD2 in the unfolded state may display the image IM on the display surfaces of the first to third non-folding areas NFA1 to NFA3 and the display surfaces of the first and second folding areas FA1 and FA2.

Figure 3A:
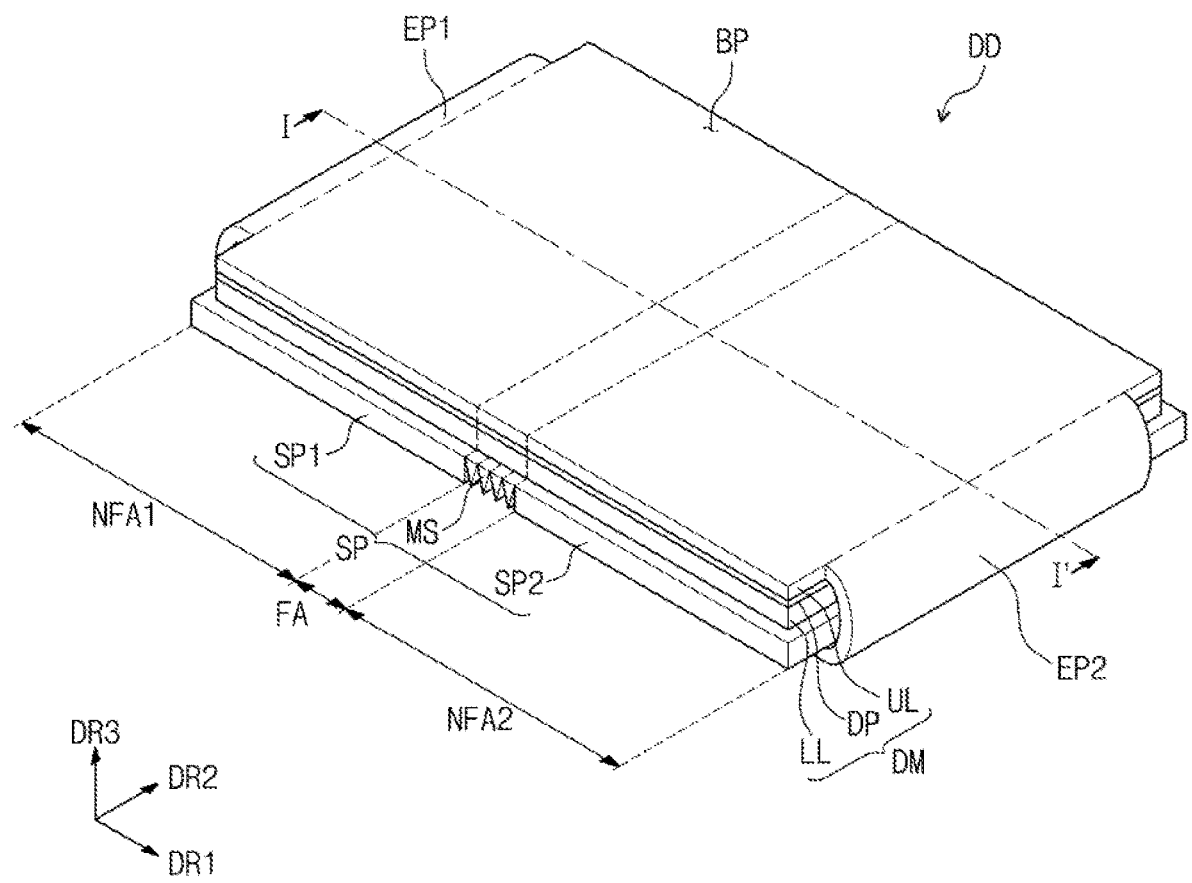
FIG. 3A is a perspective view of a display device according to an embodiment of the inventive concept.
Figure 3B:
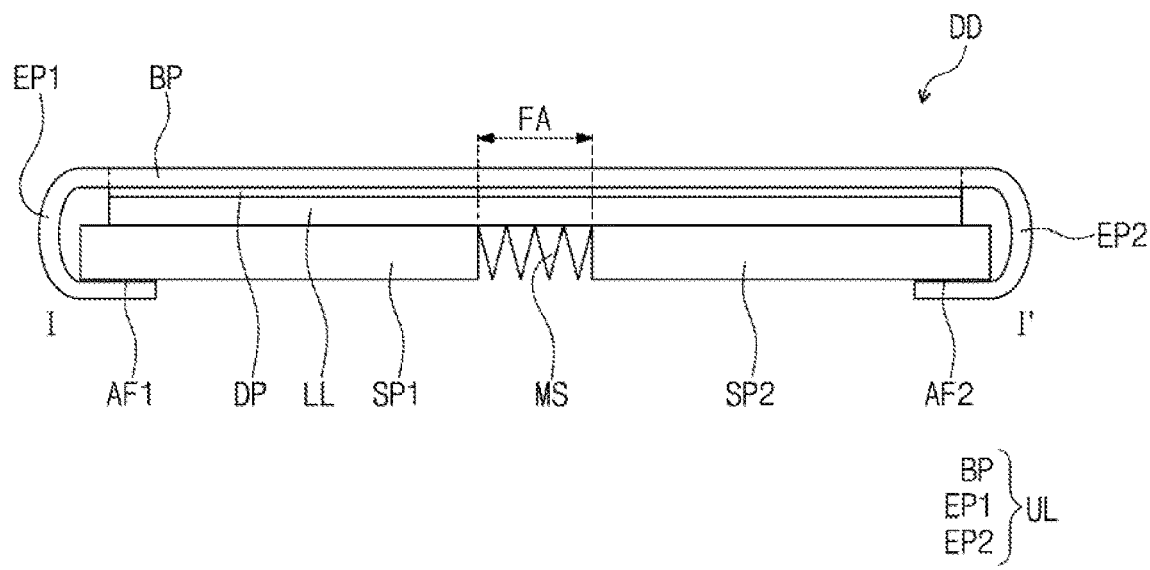
FIG. 3B is a cross-sectional view taken along line I-I' of FIG. 3A.
Figure 3C:
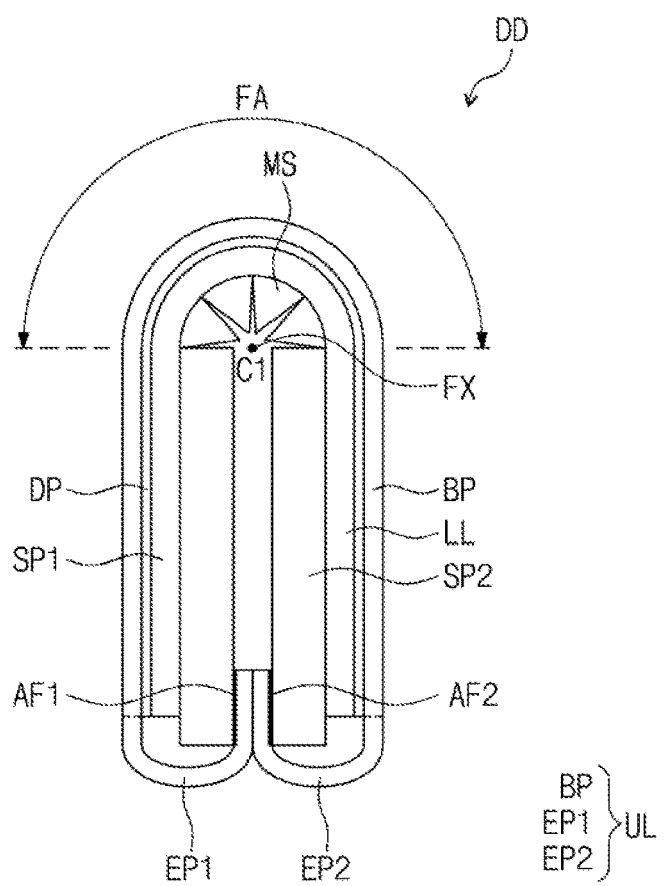
FIG. 3C is a cross-sectional view of the display device in a folded state.
Figure 3D:
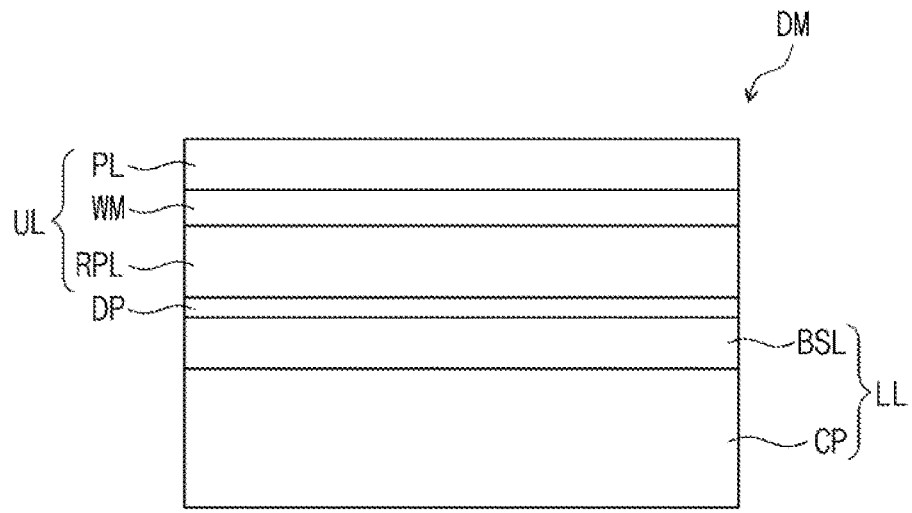
FIG. 3D is a cross-sectional view of a display module of FIG. 3B according to an embodiment of the inventive concept.
Figure 3E:
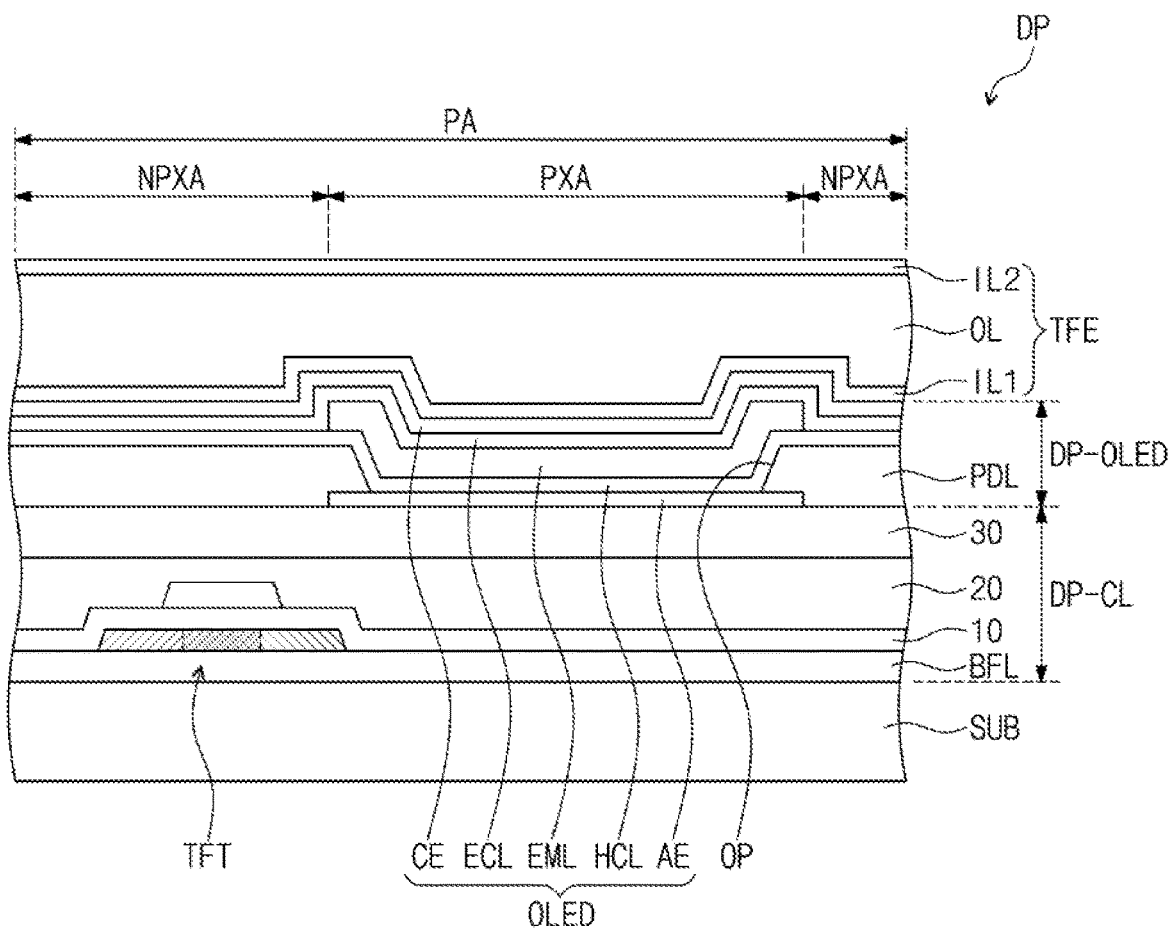
FIG. 3E is a cross-sectional view of a display panel of FIG. 3D according to an embodiment of the inventive concept.
Figure 4A:
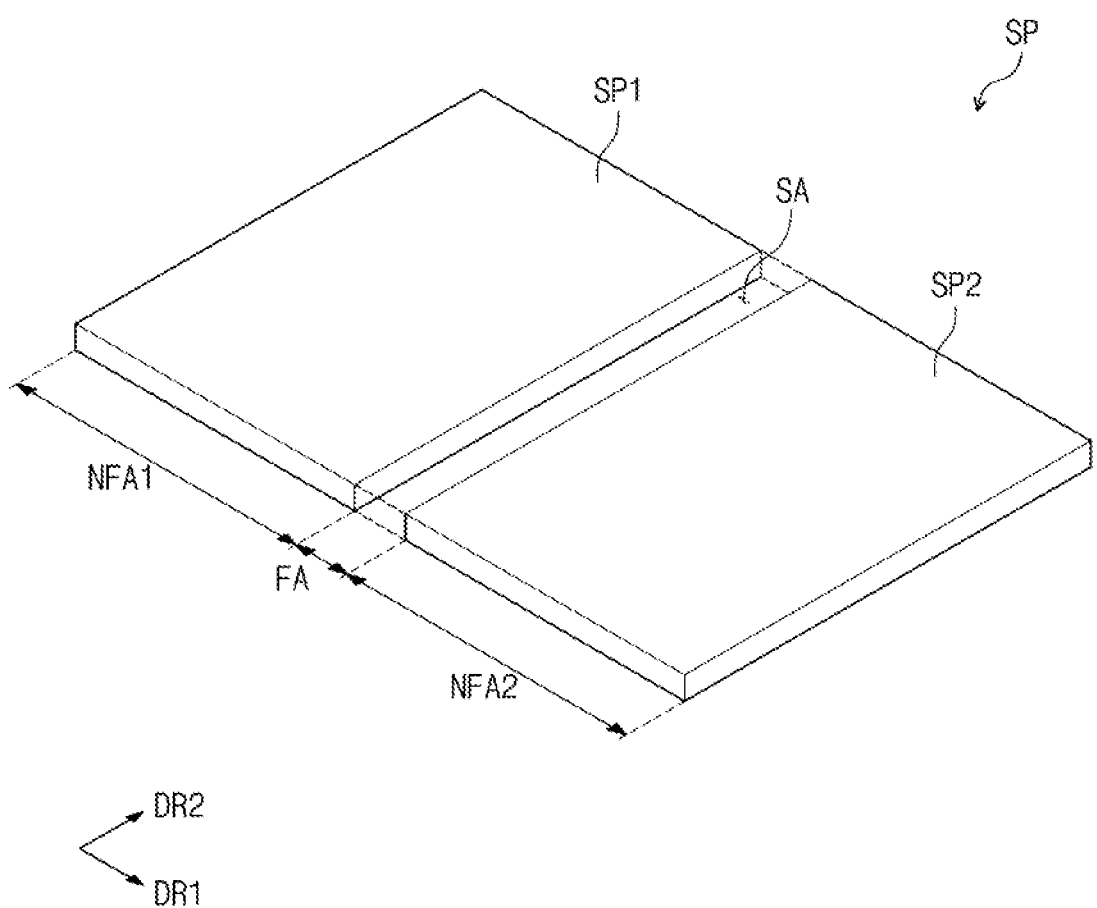
FIGS. 4A to 4C are perspective views of a support plate according to an embodiment of the inventive concept.
Figure 4B:
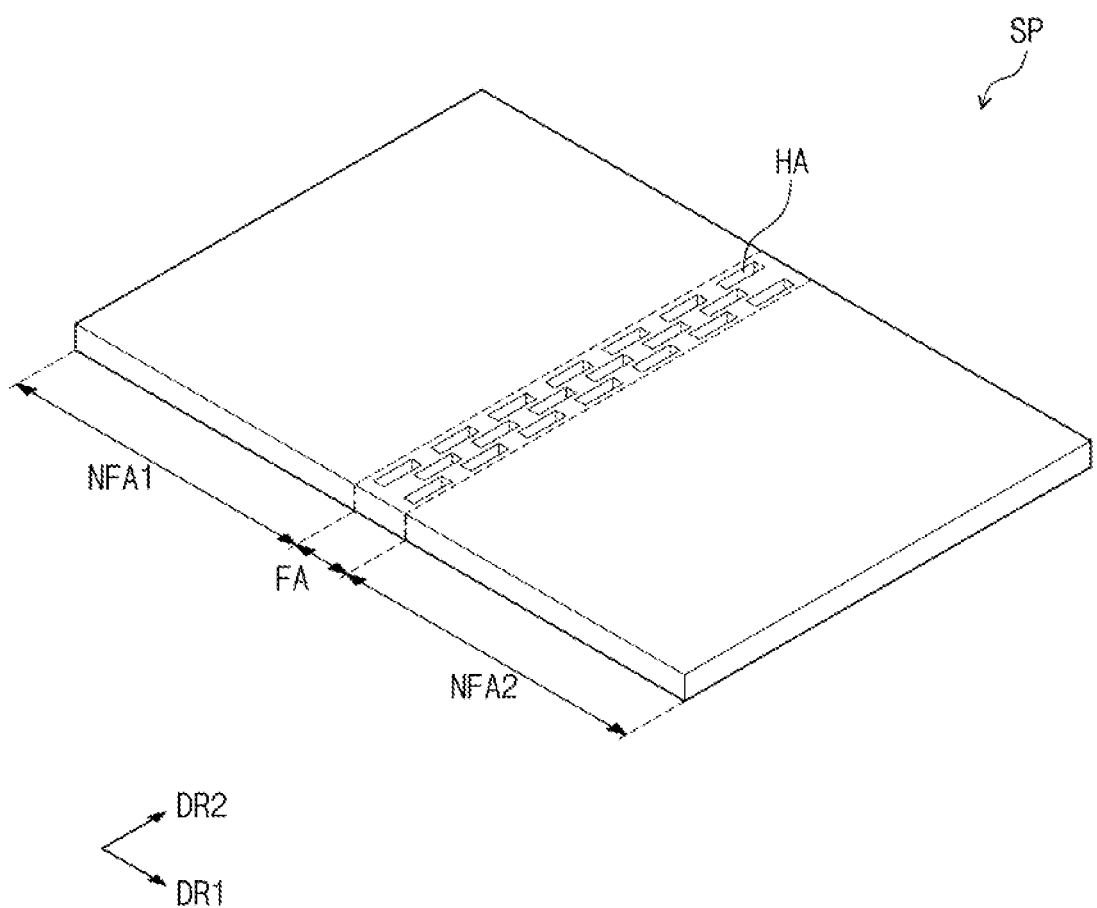
Figure 4C:
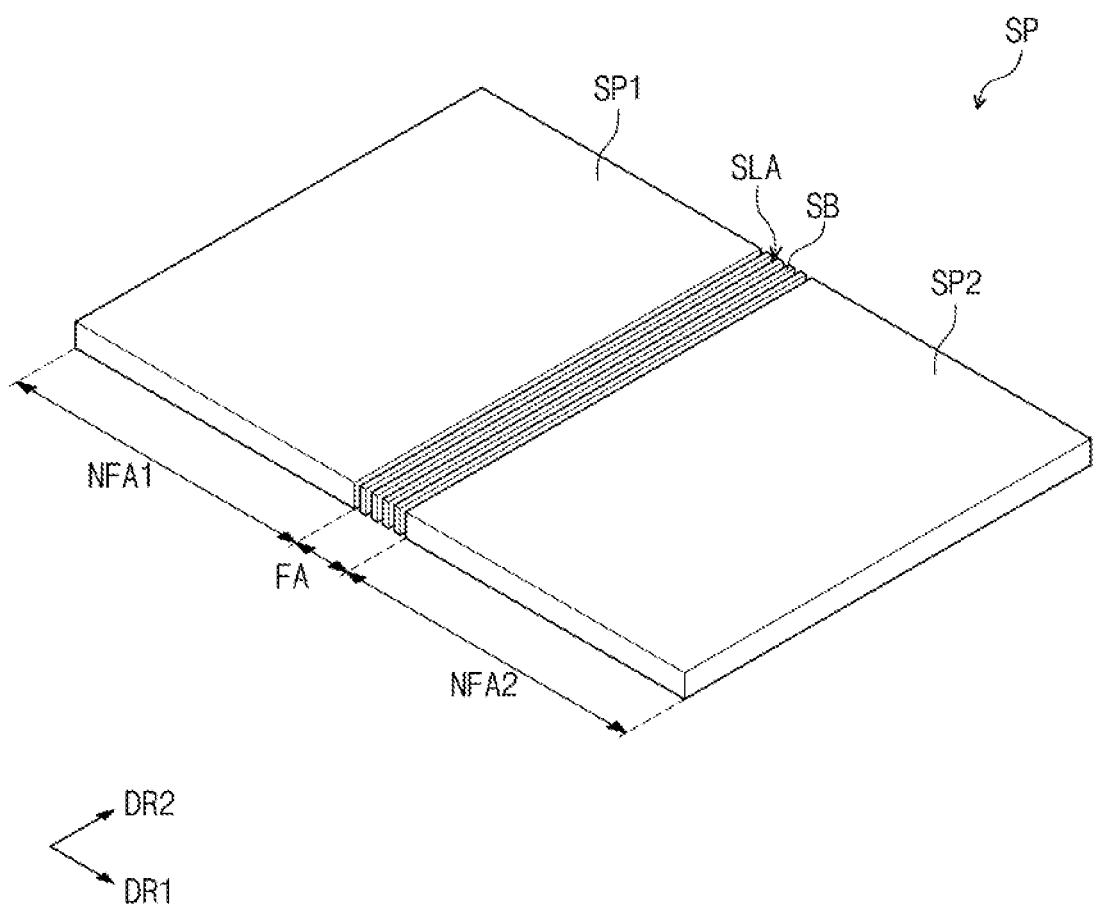

FIG. 3A is a perspective view of a display device according to an embodiment of the inventive concept. FIG. 3B is a cross-sectional view taken along line I-I' of FIG. 3A. FIG. 3C is a cross-sectional view of the display device in a folded state. FIG. 3D is a cross-sectional view of a display module of FIG. 3B according to an embodiment of the inventive concept, and FIG. 3E is a cross-sectional view of a display panel of FIG. 3D, according to an embodiment of the inventive concept. FIGS. 4A to 4C are perspective views of a support plate according to an embodiment of the inventive concept.

A display device DD illustrated in FIG. 3A corresponds to a specific embodiment of the display device DD1 described with reference to FIGS. 1A through 1C. However, a structure of the display device DD illustrated in FIG. 3 may be applicable to the display device DD2 described with reference to FIGS. 2A to 2C.

The display device DD, according to an embodiment, may include a display module DM and a support plate SP. The display module DM may be a flexible display module with flexibility. For example, the entire display module DM may be flexible, or a portion of the display module DM may be flexible. For example, a portion of the display module DM corresponding to the folding area FA may be flexible. The display module DM may include the first non-folding area NFA1, the second non-folding area NFA2, and the folding area FA. The first non-folding area NFA1, the second non-folding area NFA2, and the folding area FA are described with reference to FIGS. 1A to 1C.

The support plate SP may be coupled to a rear surface of the display module DM. The support plate SP may support the display module DM. The coupling structure of the display module DM and the support plate SP is not particularly limited. The support plate SP may be a metal plate. The support plate SP may be a stainless steel plate. The support plate SP may have strength greater than that of the display module DM.

The support plate SP may include the support plates SP1 and SP2 with the number corresponding to the number of non-folding areas NFA1 and NFA2. For example, the support plate SP may include a first support plate SP1 that supports the first non-folding area NFA1 of the display module DM and a second support plate SP2 that supports the second non-folding area NFA2 of the display module DM. Each of the first and second support plates SP1 and SP2 may have a plate shape.

The first support plate SP1 and the second support plate SP2 are disposed to be spaced apart from each other in the first direction DR1. The first and second support plates SP1 and SP2 may be spaced apart from each other with respect to the folding area FA. The first support plate SP1 may partially overlap the folding area FA, and the second support plate SP2 may partially overlap the folding area FA. For example, a spaced distance between the first and second support plates SP1 and SP2 in the first direction DR1 may be less than or equal to a width of the folding area FA.

The support plate SP may be coupled to the display module DM through an adhesive film. The adhesive film may include a first adhesive film that couples the first support plate SP1 to a rear surface of the display module DM. Additionally, the adhesive film may include a second adhesive film that couples the second support plate SP2 to a rear surface of the display module DM.

The support plate SP may further include a connection module that connects the first and second support plates SP1 and SP2 to each other. The connection module may include a hinge module or a multi-joint module MS. In FIG. 3A, the multi-joint module MS including a plurality of joints is illustrated as an example, but the structure of the connection module is not limited thereto.

As illustrated in FIG. 4A, the support plate SP may include a first support plate SP1 disposed to correspond to the first non-folding area NFA1 and a second support plate SP2 disposed to correspond to the second non-folding area NFA2. Each of the first and second support plates SP1 and SP2 may have a plate shape.

The first support plate SP1 and the second support plate SP2 are disposed to be spaced apart from each other in the first direction DR1. The first and second support plates SP1 and SP2 may be spaced apart from each other with respect to the folding area FA. For example, a spaced space between the first and second support plates SP1 and SP2 may be defined within the folding area FA.

Although not shown in the drawings, the first and second support plates SP1 and SP2 may be connected through a hinge or the like.

As another example of the inventive concept, as illustrated in FIG. 4B, the support plate SP may be provided in the form of one whole plate disposed to correspond to the first and second non-folding areas NFA1 and NFA2 and the folding area FA. Here, the support plate SP may include a plurality of holes HA defined in the folding area FA. The plurality of holes HA may be arranged in a zigzag shape or pattern. Additionally, the plurality of holes HA may pass through the support plate SP. Each of the plurality of holes HA may have a rectangular shape extending in the second direction DR2 along the folding area FA. However, the shape of each of the plurality of holes HA is not limited thereto. For example, the plurality of holes HA may have a diamond shape or a circular shape.

Referring to FIG. 4C, the support plate SP may include a first support plate SP1 disposed to correspond to the first non-folding area NFA1, a second support plate SP2 disposed to correspond to the second non-folding area NFA2, and a plurality of support bars SB disposed to correspond to the folding area FA. Each of the first and second support plates SP1 and SP2 may have a plate shape. The plurality of support bars SB are disposed between the first and second support plates SP1 and SP2, and each of the plurality of support bars SB has a bar shape extending in the second direction DR2. A slit SLA may be provided between the plurality of support bars SB. The plurality of support bars SB may be spaced apart from each other by the slit SLA. The outermost support bars disposed at the ends of the plurality of support bars SB may be spaced apart from each other by the first and second support plates SP1 and SP2 and the slit SLA.

In addition to the structure illustrated in FIGS. 4A to 4C, the support plate SP may adopt various structures. Hereinafter, in describing the embodiments of the inventive concept, a structure including a multi-joint module MS (illustrated in FIG. 3A) will be exemplarily illustrated.

The display module DM may be rolled or folded on a specific area. The display module DM may include a display panel DP and a plurality of layers provided above and below the display panel DP. The display panel DP may be an organic light-emitting display panel, an electrophoretic display panel, an electrowetting display panel, or the like. Functional members may include a protective member, an optical member, a touch panel, and the like.

Hereinafter, the layer disposed above the display panel DP may be defined as an upper layer UL, and the layer disposed below the display panel DP may be defined as a lower layer LL. The lower layer LL may be a layer disposed between the display panel DP and the support plate SP.

As illustrated in FIG. 3D, the upper layer UL may include an anti-reflection layer RPL, a window WM, and a protective layer PL. The anti-reflection layer RPL may prevent elements constituting the display panel DP from being visually recognized at the outside by external light incident through a front surface of the display device DD. The anti-reflection layer RPL may include a polarizing film and/or a phase delay film. The number of phase delay films and a phase delay length ($\lambda/4$ or $\lambda/2$) of the phase delay film may be determined according to an operation principle of the anti-reflection layer RPL.

An input sensing layer that senses an external input may be further disposed between the anti-reflection layer RPL and the display panel DP. The input sensing layer may be disposed on the display panel DP in the form of a panel or may be integrated with the display panel DP through at least one continuous process. For example, the input sensing layer may be directly disposed on a thin-film encapsulation layer TFE of the display panel DP (illustrated in FIG. 3E). Here, the direct disposition may mean that the input sensing layer is disposed on the display panel DP without a separate adhesive member.

The window WM may be optically transparent. Therefore, an image generated in the display panel DP may pass through the window WM. As a result, an image may be recognized by the user.

The window WM may be made of a flexible material. Therefore, the window WM may be folded or unfolded with respect to the folding axis FX. For example, the window WM may be a plastic plate or a resin film including an organic material.

The protective layer PL is disposed on the window WM. The protective layer PL may include a polymer material. The protective layer PL may be a layer that absorbs an impact applied from the outside to protect the display panel DP from the impact. FIG. 3D illustrates the structure in which the protective layer PL is disposed on the window WM, but the embodiment of the inventive concept is not limited thereto. For example, the protective layer PL may be disposed between the window WM and the anti-reflection layer RPL. Additionally, the protective layer PL may be disposed between the window WM and the anti-reflection layer RPL and on the window WM.

FIG. 3D illustrates the structure in which the upper layer UL includes the anti-reflection layer RPL, the window WM, and the protective layer PL, but the embodiment of the inventive concept is not limited thereto. For example, the upper layer UL may further include a functional layer in addition to the above layer or may not include at least one of the above layers.

Referring to FIGS. 3A to 3C, the upper layer UL may include a body part BP and extension parts EP1 and EP2 extending from the body part BP. The body part BP may have a rectangular plate shape. Each of the extension parts EP1 and EP2 may extend from one side of the body part BP. The body part BP may include two long sides extending in the first direction DR1 and two short sides (hereinafter, referred to as first and second short sides) extending in the second direction DR2. In FIG. 3A, the extension parts EP1 and EP2 include a first extension part EP1 extending from a first short side and a second extension part EP2 extending from a second short side.

The first extension part EP1 may be bent from the body part BP so that one end of the first extension part EP1 is disposed on a rear surface of the first support plate SP1. The second extension part EP2 may be bent from the body part BP so that one end of the second extension part EP2 is disposed on a rear surface of the second support plate SP2.

The first adhesive film AF1 is disposed between the first extension part EP1 and the rear surface of the first support plate SP1. The second adhesive film AF2 is disposed between the second extension part EP2 and the rear surface of the second support plate SP2. Accordingly, the first extension part EP1 is coupled to the rear surface of the first support plate SP1 by the first adhesive film AF1. Additionally, the second extension part EP2 is coupled to the rear surface of the second support plate SP2 by the second adhesive film AF2.

FIGS. 3A to 3C illustrate a structure in which the upper layer UL includes first and second extension parts EP1 and EP2. The layers constituting the upper layer UL include the first and second extension parts EP1, EP2. Alternatively, at least one of the plurality of layers constituting the upper layer UL includes the first and second extension parts EP1 and EP2. For example, each of the anti-reflection layer RPL, the window WM, and the protective layer PL, which constitute the upper layer UL, may include the first and second extension parts EP1 and EP2. For another example, at least one layer of the anti-reflection layer RPL, the window WM, and the protective layer PL may include the first and second extension parts EP1 and EP2. For example, the window WM of the plurality of layers may include the first and second extension parts EP1 and EP2.

As illustrated in FIG. 3D, the lower layer LL may include a base layer BSL and a cover panel CP. The base layer BSL may include a polymer material. A material constituting the base layer BSL is not limited to plastic resins. For example, the base layer BSL may include an organic/inorganic composite material. The base layer BSL may include a porous organic layer and an inorganic material filled into pores of the organic layer. For example, the base layer BSL may be made of a hydrophilic material.

The base layer BSL may have a structure in which some areas are patterned. For example, in the structure in which the display panel DP is bent to the rear surface of the support plate SP, the base layer BSL may be opened in the bending area of the display panel DP.

The cover panel CP may include at least one buffer film that absorbs an impact applied from the outside. The buffer film may be coupled to the support plate SP through the adhesive film. The buffer film may comprise a polymeric material.

As illustrated in FIG. 3C, the folding area FA of the display device DD may be out-folded with respect to the folding axis FX passing through a folding center C1. The display device DD may be folded to expose the display surface DS of the display module DM. In the folded state, the upper layer UL, which is disposed at a position far from the folding center C1 of the display modules DM has a curvature radius greater than that of the lower layer LL close to the folding center C1. Therefore, the upper layer UL has a degree of deformation due to the folding. When the folded state is maintained for a long time, a drooping or bending phenomenon of a portion of the upper layer UL on the folding area FA may occur. Additionally, bending deformation may occur in the upper layer UL on the folding area FA.

However, an edge of the upper layer UL may not be pushed toward the folding center C1 by restriction force of the first and second support plates SP1 and SP2 when the first and second extension parts EP1 and EP2 are coupled to the first and second support plates SP1 and SP2, respectively. Therefore, even though the folded state is maintained for a long time, the bending deformation may not occur in the upper layer UL on the folding area FA, or the degree of the deformation may be reduced.

Referring to FIG. 3E, the display panel DP includes a base layer SUB, a circuit layer DP-CL disposed on the base layer SUB, a display element layer DP-OLED, and a thin-film encapsulation layer TFE. The base layer SUB may include at least one plastic film. The base layer SUB may include a plastic substrate, a glass substrate, a metal substrate, or an organic/inorganic composite substrate as a flexible substrate.

The circuit layer DP-CL may include at least one intermediate insulation layer, a plurality of conductive layers, and a semiconductor layer. The plurality of conductive layers of the circuit layer DP-CL may constitute signal lines or a pixel circuit. The pixel circuit may include thin-film transistors TFT and a capacitor.

The display element layer DP-OLED is disposed on the circuit layer DP-CL. For example, the display element layer DP-OLED may be disposed to correspond to an emission area PXA of the pixel area PA. The display element layer DP-OLED may include a display element, for example, organic light-emitting diodes.

The thin-film encapsulation layer TFE may be directly disposed on the display element layer DP-OLED or directly disposed on the functional layer disposed on the display element layer DP-OLED. The thin-film encapsulation layer TFE may be manufactured through a continuous process with the display element layer DP-OLED.

The thin-film encapsulation layer TFE may include at least one inorganic layer IL1 and IL2 and at least one organic layer OL. The inorganic layer protects the display element layer DP-OLED against moisture/oxygen, and the organic layer protects the display element layer DP-OLED against foreign substances such as dust particles.

As illustrated in FIG. 3E, the circuit layer DP-CL is disposed on the base layer SUB. The circuit layer DP-CL may include a plurality of insulation layers BFL, 10, 20, and 30 and a thin-film transistor TFT. Each of the plurality of insulation layers BFL, 10, 20, and 30 may include an organic material and/or an inorganic material and may have a single layer or a multilayer structure. A portion of the plurality of insulation layers BFL, 10, 20, and 30, for example, a buffer layer BFL, may be omitted, and another insulation layer may be further disposed.

The display element layer DP-OLED is disposed on the circuit layer DP-CL. The display element layer DP-OLED may include a pixel defining layer PDL and an organic light-emitting diode OLED. Each pixel area PA of the display panel DP may be divided into an emission area PXA on which the organic light-emitting diode OLED is disposed and a non-emission area NPXA adjacent to the emission area PXA. An opening OP of the pixel defining layer PDL exposes at least a portion of the first electrode AE. The opening OP of the pixel defining layer PDL may correspond to the emission area PXA.

The organic light-emitting diode OLED may include a first electrode AE, a second electrode CE, and a light-emitting functional layer disposed between the first electrode AE and the second electrode CE. In this embodiment, the organic light-emitting diode OLED with a top emission structure that emits light toward the second electrode CE will be described. The second electrode CE is disposed closer to the thin-film encapsulation layer TFE than the first electrode AE.

In FIG. 3E, the light-emitting functional layer includes a first charge control layer HCL, an emission layer EML, and a second charge control layer ECL, but a stacked structure of the light-emitting functional layer is not limited thereto. The emission layer EML may include an organic light-emitting material in which a host and a dopant are mixed with each other and/or an inorganic light-emitting material such as semiconductor nanocrystals (e.g., quantum dots, quantum rods, and quantum tubes). Each of the first charge control layer HCL and the second charge control layer ECL injects and/or transports corresponding charges of electrons and holes. Although not separately illustrated, the light-emitting functional layer and the second electrode CE may be commonly disposed on the plurality of emission areas PXA and the non-emission areas NPXA adjacent to the emission areas PXA.

The first electrode AE may include a reflection layer. For example, the reflection layer includes at least one selected from the group of silver (Ag), magnesium (Mg), aluminum (Al), platinum (Pt), palladium (Pd), gold (Au), nickel (Ni), neodymium (Nd), iridium (Ir), and chromium (Cr). A transparent layer or a translucent layer made of at least one selected from the group of indium tin oxide (ITO), indium zinc oxide (IZO), zinc oxide (ZnO), indium oxide ($In_2O_3$), indium gallium oxide (IGO), and aluminum zinc oxide (AZO) may be further disposed on the first electrode AE. In this embodiment, the first electrode AE may include three layers of indium tin oxide (ITO)/silver (Ag)/indium tin oxide (ITO).

The second electrode CE may include a conductive material with low absorptivity and high reflectance. The second electrode CE may be a translucent electrode so as to provide a resonance structure together with the first electrode AE. The second electrode CE may include a conductive material in which a product of a refractive index and an extinction ratio is 1 to 10 in a visible light region. For example, the second electrode CE includes one or more materials selected from silver (Ag), aluminum (Al), ytterbium (Yb), titanium (Ti), magnesium (Mg), nickel (Ni), lithium (Li), calcium (Ca), copper (Cu), LiF/Ca, LiF/Al, MgAg, and CaAg.

Figure 5A:
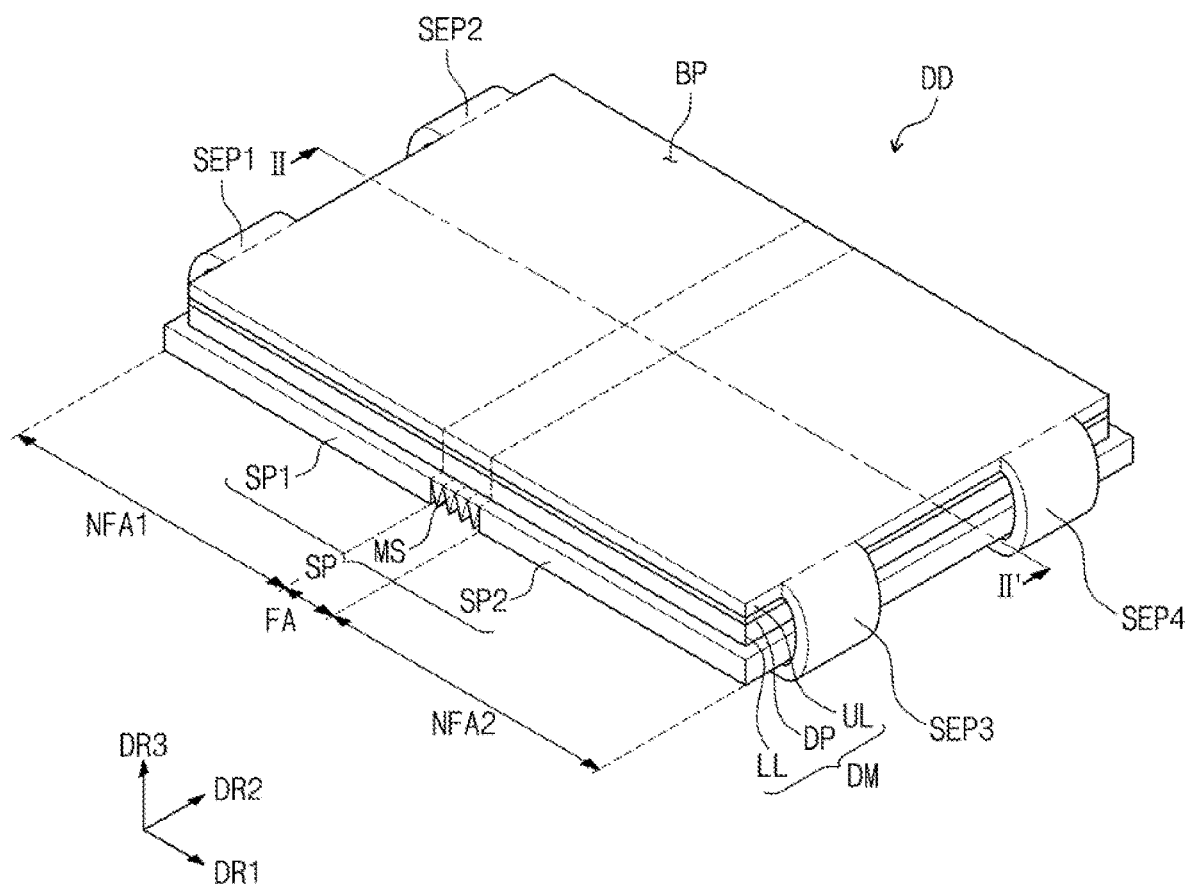
FIG. 5A is a perspective view of a display device according to an embodiment of the inventive concept.
Figure 5B:
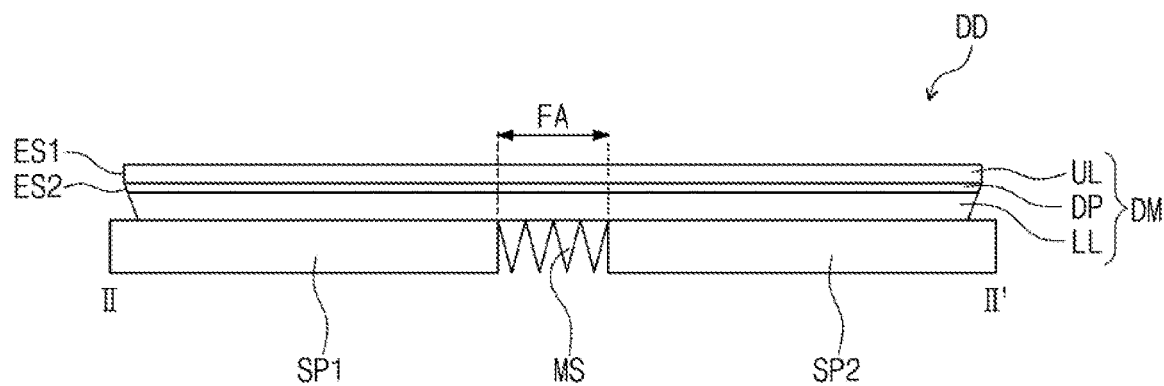
FIG. 5B is a cross-sectional view taken along line II-II' of FIG. 5A.

FIG. 5A is a perspective view of the display device according to an embodiment of the inventive concept, and FIG. 5B is a cross-sectional view taken along line II-II' of FIG. 5A.

Referring to FIGS. 5A and 5B, the upper layer UL may include a body part BP and extension parts SEP1, SEP2, SEP3, and SEP4 extending from the body part BP. The extension parts SEP1, SEP2, SEP3, and SEP4 may extend from one side of the body part BP. In FIG. 5A, the extension parts SEP1, SEP2, SEP3, and SEP4 include first and second extension parts SEP1 and SEP2 extending from first short sides of the body part BP and third and fourth extension parts SEP3 and SEP4 extending from second short sides of the body part BP.

The first and second extension parts SEP1 and SEP2 may be bent from the body part BP, and the third and fourth extension parts SEP3 and SEP4 may be bent from the body part BP. Accordingly, one end of each of the first and second extension parts SEP1 and SEP2 is disposed on a rear surface of the first support plate SP1, and one end of each of the third and fourth extension parts SEP3 and SEP4 is disposed on a rear surface of the second support plate SP2.

A fifth adhesive film AF5 (see FIG. 6D) is disposed between the first extension part SEP1 and the rear surface of the first support plate SP1, and a sixth adhesive film AF6 (see FIG. 6D) may be disposed between the second extension part SEP2 and the rear surface of the first support plate SP1. Therefore, the first and second extension parts SEP1 and SEP2 are coupled to the rear surface of the first support plate SP1 by the fifth and sixth adhesive films AF5 and AF6. Additionally, a seventh adhesive film AF7 (see FIG. 6D) is disposed between the third extension part SEP3 and the rear surface of the second support plate SP2, and an eighth adhesive film AF8 (see FIG. 6D) may be disposed between the fourth extension part SEP4 and the rear surface of the second support plate SP2. Accordingly, the third and fourth extension pans SEP3 and SEP4 are coupled to the rear surface of the second support plate SP2 by the seventh and eighth adhesive films AF7 and AF8.

As described above, an edge of the upper layer UL may be prevented from being pushed toward the folding area FA when the first to fourth extension parts SEP1 to SEP4 are fixed to the first and second support plates SP1 and SP2. Therefore, even though the folded state is maintained for a long time, the bending deformation may not occur in the upper layer UL on the folding area FA, or the degree of the deformation may be reduced.

Additionally, the upper layer UL may receive force pulled toward the rear surfaces of the first and second support plates SP1 and SP2 when the first to fourth extension parts SEP1 to SEP4 are fixed to the first and second support plates SP1 and SP2. Therefore, as illustrated in FIG. 5B, an end surface ES1 of the upper layer UL may be disposed outside an end surface ES2 of the display panel DP.

Figure 6A:
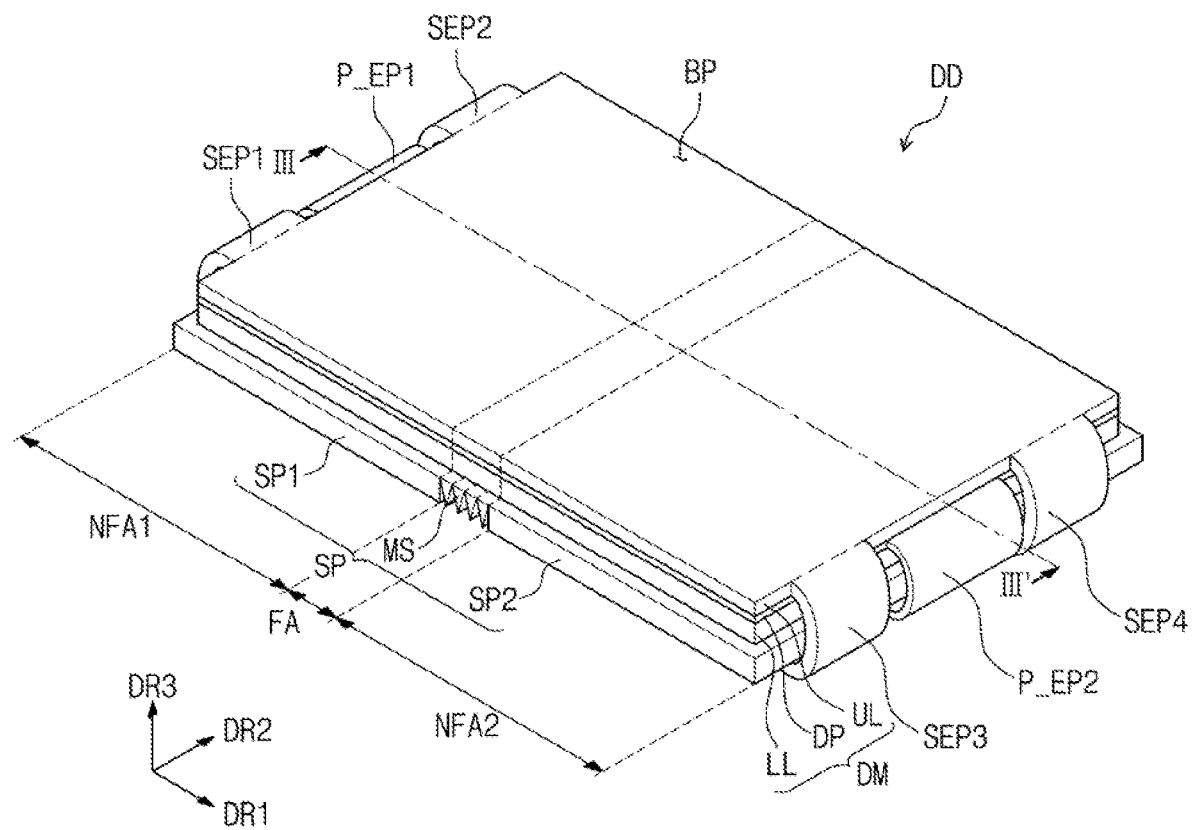
FIG. 6A is a perspective view of a display device according to an embodiment of the inventive concept.
Figure 6B:
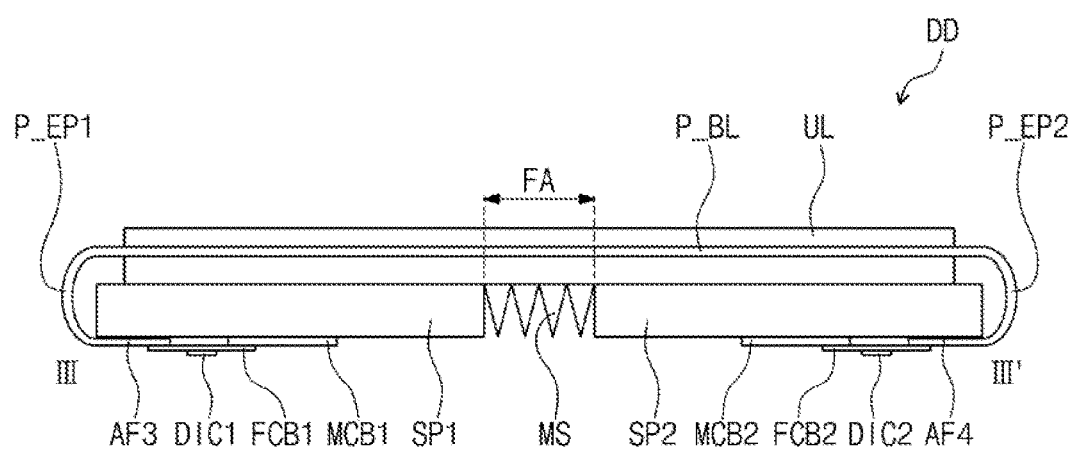
FIG. 6B is a cross-sectional view taken along line III-III' of FIG. 6A.
Figure 6C:
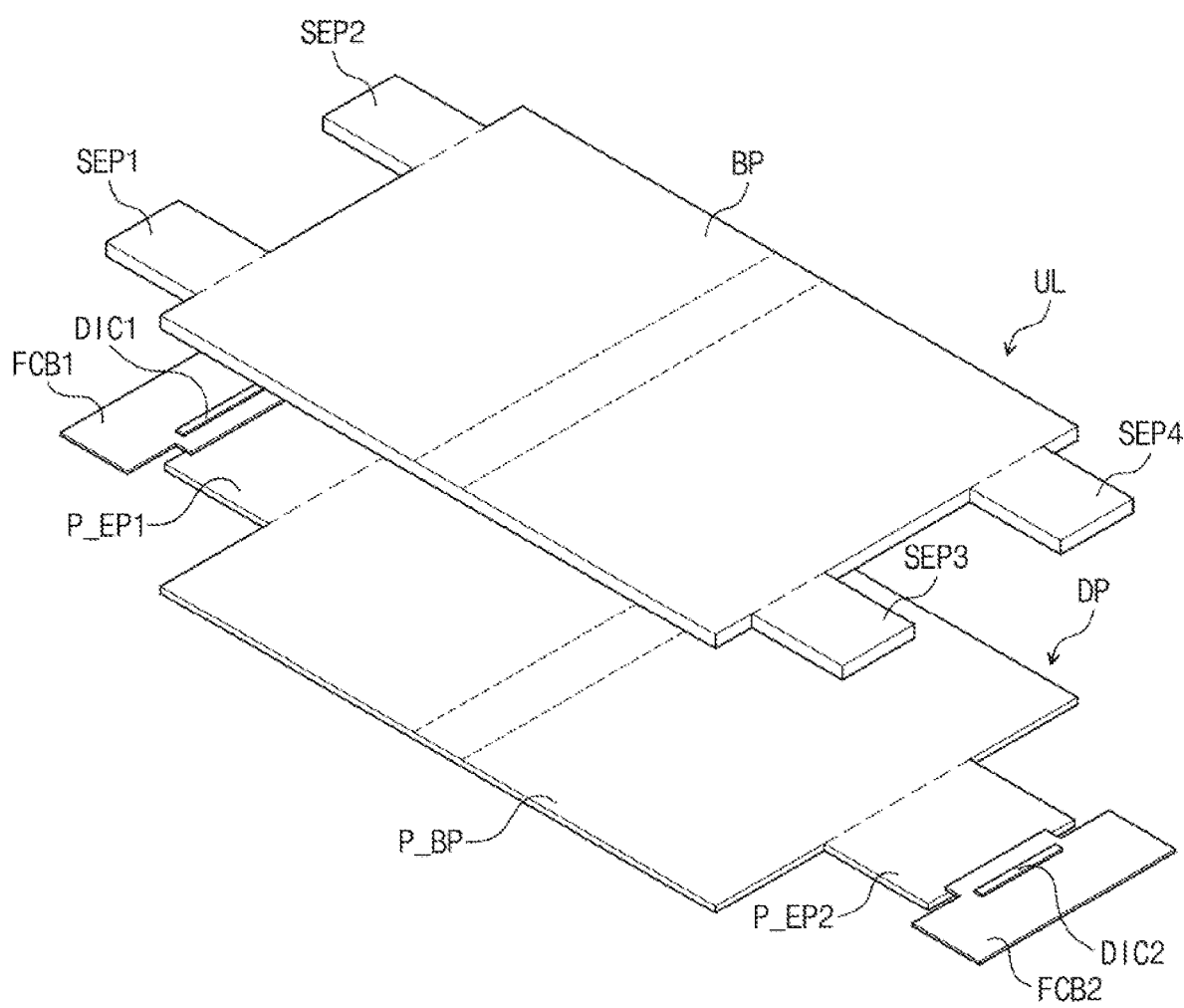
FIG. 6C is an exploded perspective view of a display panel and an upper layer of FIG. 6A.
Figure 6D:
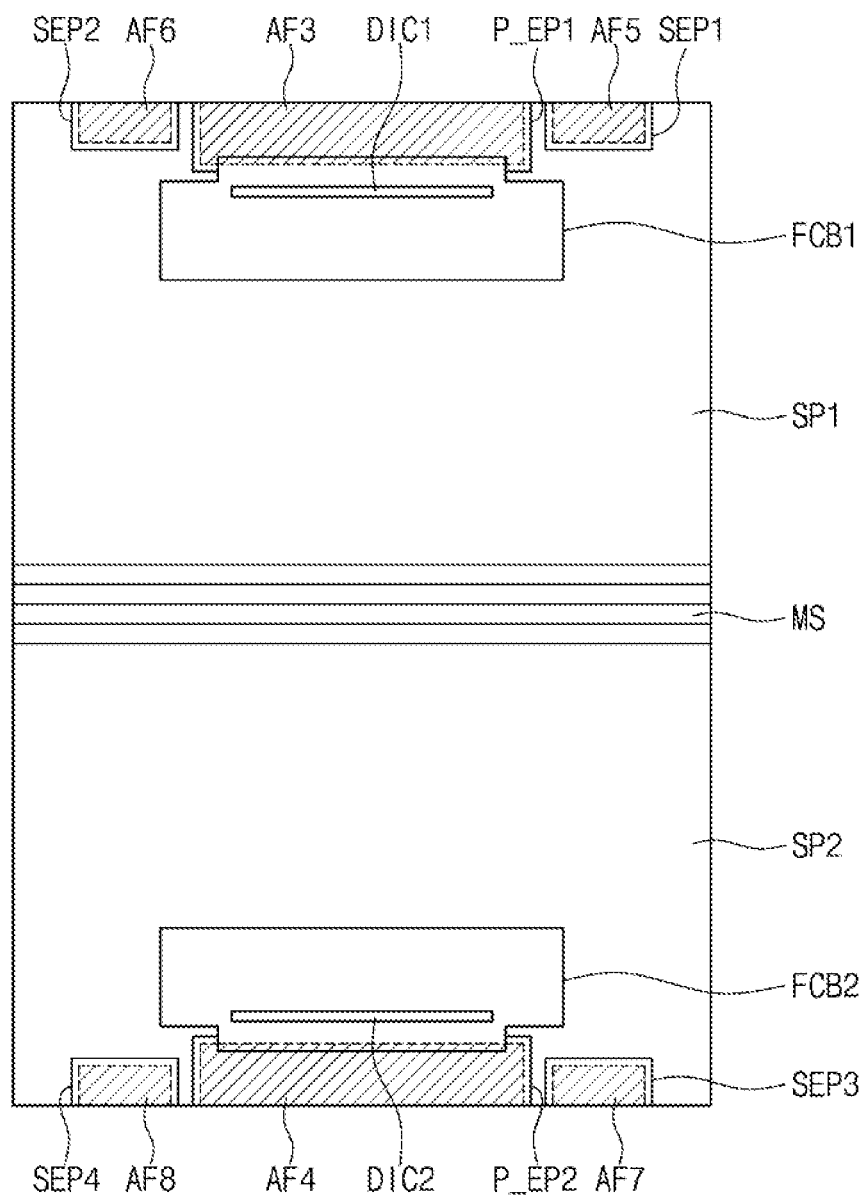
FIG. 6D is a bottom view of the display device of FIG. 6A.

FIG. 6A is a perspective view of the display device according to an embodiment of the inventive concept, and FIG. 6B is a cross-sectional view taken along line III-III' of FIG. 6A. FIG. 6C is an exploded perspective view of the display panel and the upper layer of FIG. 6A. FIG. 6D is a bottom view of the display device of FIG. 6A. In FIGS. 6A to 6D, the same components as those of FIGS. 5A and 5B will be designated by the same reference numeral, and their detailed descriptions will be omitted.

Referring to FIGS. 6A to 6D, in the display device DD, according to an embodiment of the inventive concept, the display panel DP includes a panel body part P_BP and a panel extension part P_EP1, and P_EP2 extending from the panel body part P_BP. In FIG. 6A, the panel extension parts P_EP1 and P_EP2 include the first panel extension part P_EP1 extending from a first short side of the panel body part P_BP and the second panel extension part P_EP2 extending a second short side of the panel body part P_BP.

For example, a first flexible circuit board FCB1 is attached to the first panel extension part P_EP1, and a second flexible circuit board FCB2 is attached to the second panel extension part P_EP2. First and second driving chips DIC1 and DIC2 may be mounted on the first and second flexible circuit boards FCB1 and FCB2, respectively. However, the embodiment of the inventive concept is not limited thereto. In another example, one flexible circuit board may be attached to one of the first and second panel extension parts P_EP1 and P_EP2.

Additionally, in another embodiment of the inventive concept, the display panel DP may include one panel extension part extending from one side of the panel body part P_BP. In this case, the one flexible circuit board may be attached to one panel extension part.

The first panel extension part P_EP1 may be disposed to correspond to an area between the first and second extension parts SEP1 and SEP2 of the upper layer UL. The first panel extension part P_EP1 may be bent to the rear surface of the first support plate SP1. Therefore, the first flexible circuit board FCB1 attached to the first panel extension part P_EP1 may be seated on the rear surface of the first support plate SP1. As illustrated in FIG. 6B, the first panel extension part P_EP1 may be coupled to the rear surface of the first support plate SP1 by the third adhesive film AF3.

The second panel extension part P_EP2 may be disposed corresponding to an area between the third and fourth extension parts SEP3 and SEP4 of the upper layer UL. The second panel extension part P_EP2 may be bent to the rear surface of the second support plate SP2. Therefore, the second flexible circuit board FCB2 attached to the second panel extension part P_EP2 may be seated on the rear surface of the second support plate SP2. As illustrated in FIG. 6B, the second panel extension part P_EP2 may be coupled to the rear surface of the second support plate SP2 by the fourth adhesive film AF4.

The display module DM may further include a first main circuit board MCB1 and a second main circuit board MCB2. Components such as a control chip, a plurality of passive elements, and an active element may be mounted on the first and second main circuit boards MCB1 and MCB2. Each of the first and second main circuit boards MCB1 and MCB2 may be made of a flexible film like the first and second flexible circuit boards FCB1 and FCB2.

In this embodiment, a chip on film structure in which the first and second driving chips DIC1 and DIC2 are mounted on the first and second flexible circuit boards FCB1 and FCB2, respectively, is illustrated. However, the embodiment of the inventive concept is not limited thereto. For example, the first and second driving chips DIC1 and DIC2 may be mounted on the first and second panel extension parts P_EP1 and P_EP2, respectively.

In FIGS. 6A to 6D, the upper layer UL may be provided with the extension parts SEP1 to SEP4 to be coupled to the support plate SP. Additionally, the upper layer UL may have a structure in which the display panel DP is coupled to the rear surface of the support plate SP. In the structure in which the display panel DP is provided with the panel extension parts P_EP1 and P_EP2 that may be bent toward the rear surface of the support plate SP, the extension parts SEP1 to SEP4 of the upper layer UL may be coupled to the support plate SP at a position that does not overlap the panel extension parts P_EP1 and P_EP2 of the display panel DP.

Accordingly, the upper layer UL may be fixed to the rear surface of the support plate SP to prevent bending deformation of the upper layer UL from occurring. Additionally, one side or both sides (i.e., two opposite sides) of the display panel may be fixed to the rear surface of the support plate SP to reduce bending deformation of the folding area FA of the display panel DP.

Figure 7A:
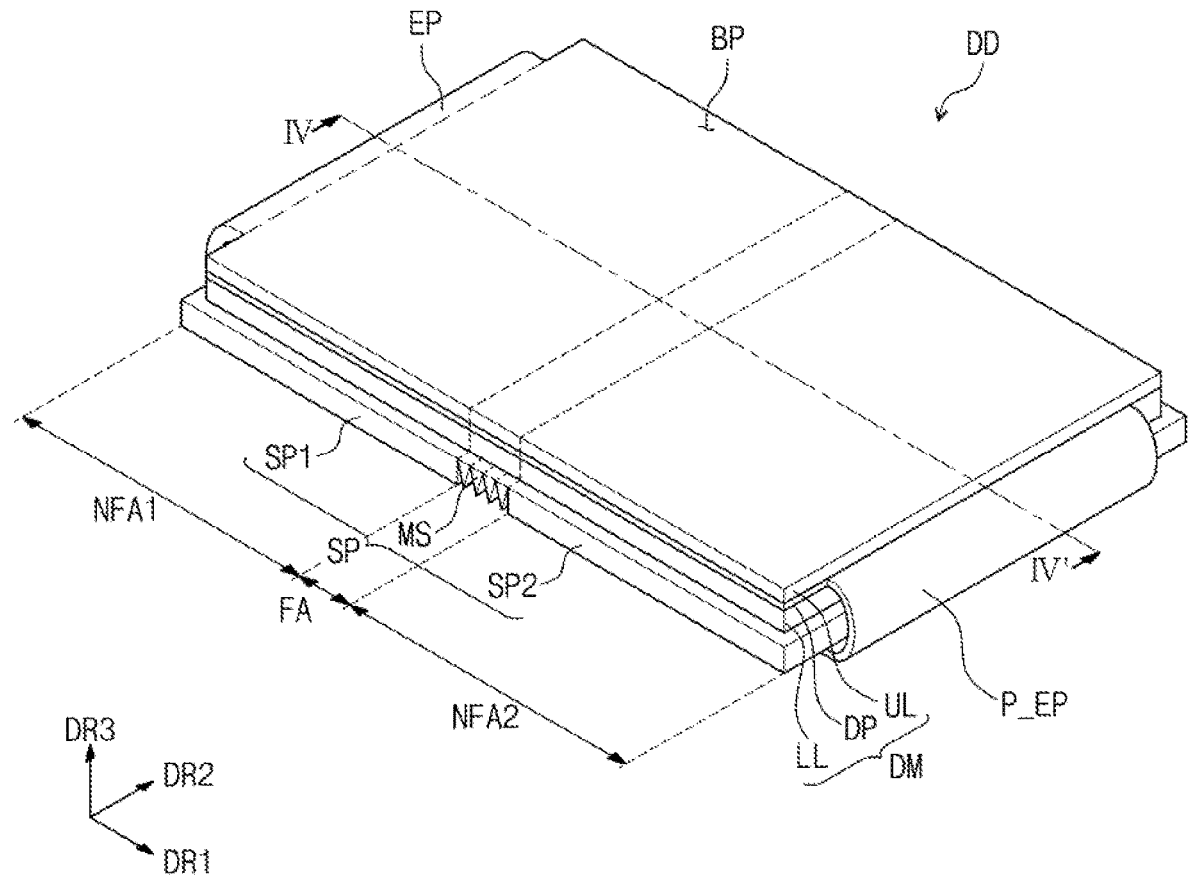
FIG. 7A is a perspective view of a display device according to an embodiment of the inventive concept.
Figure 7B:
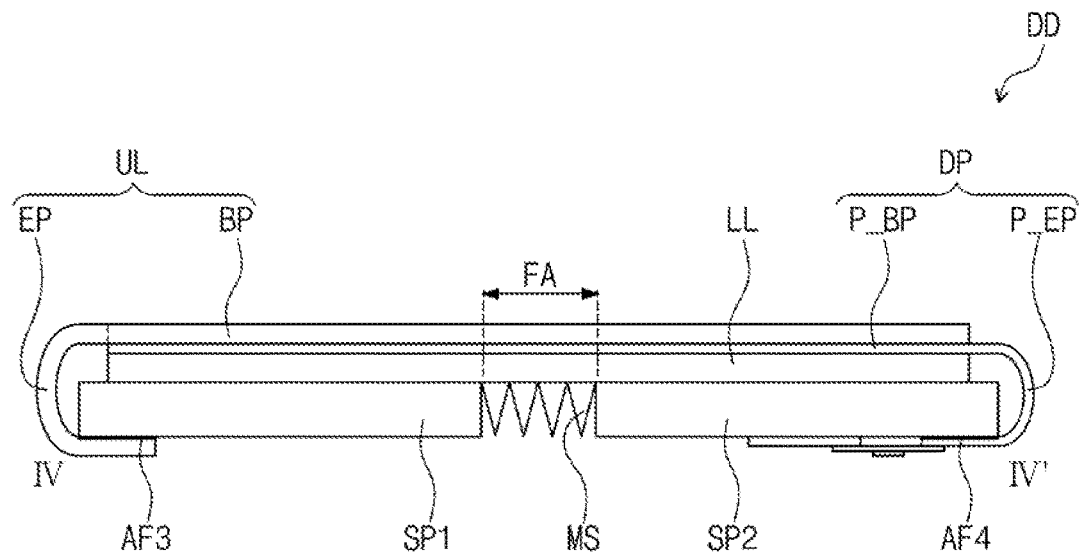
FIG. 7B is a cross-sectional view taken along line IV-IV' of FIG. 7A.

FIG. 7A is a perspective view of the display device according to an embodiment of the inventive concept, and FIG. 7B is a cross-sectional view taken along line IV-IV' of FIG. 7A.

Referring to FIGS. 7A and 7B, in the display device DD according to an embodiment of the inventive concept, the upper layer UL may include a body part BP and an extension part EP extending from one side of the body part BP. The display panel DP may include a panel body part P_BP and a panel extension part P_EP extending from the panel body part P_BP.

In FIG. 7A, the extension part EP extends from a first short side of the body part BP. The panel extension part P_EP extends from a second short side of the panel body part P_BP. The panel extension part P_EP may be disposed adjacent to the second short side of the body part BP. For example, the extension part EP may be omitted without being formed on the upper layer UL at the second short side of the body part BP on which the panel extension part P_EP is provided.

The extension part EP of the upper layer UL is bent and coupled to the rear surface of the first support plate SP1 through the third adhesive film AF3. The panel extension part P_EP is bent and coupled to the rear surface of the second support plate SP2 through the fourth adhesive film AF4. Therefore, one end and the other end of the display module DM are fixedly coupled to the first and second support plates SP1 and SP2, respectively, with respect to the folding area FA to prevent the bending deformation from occurring on the folding area FA of the display module DM.

Figure 8A:
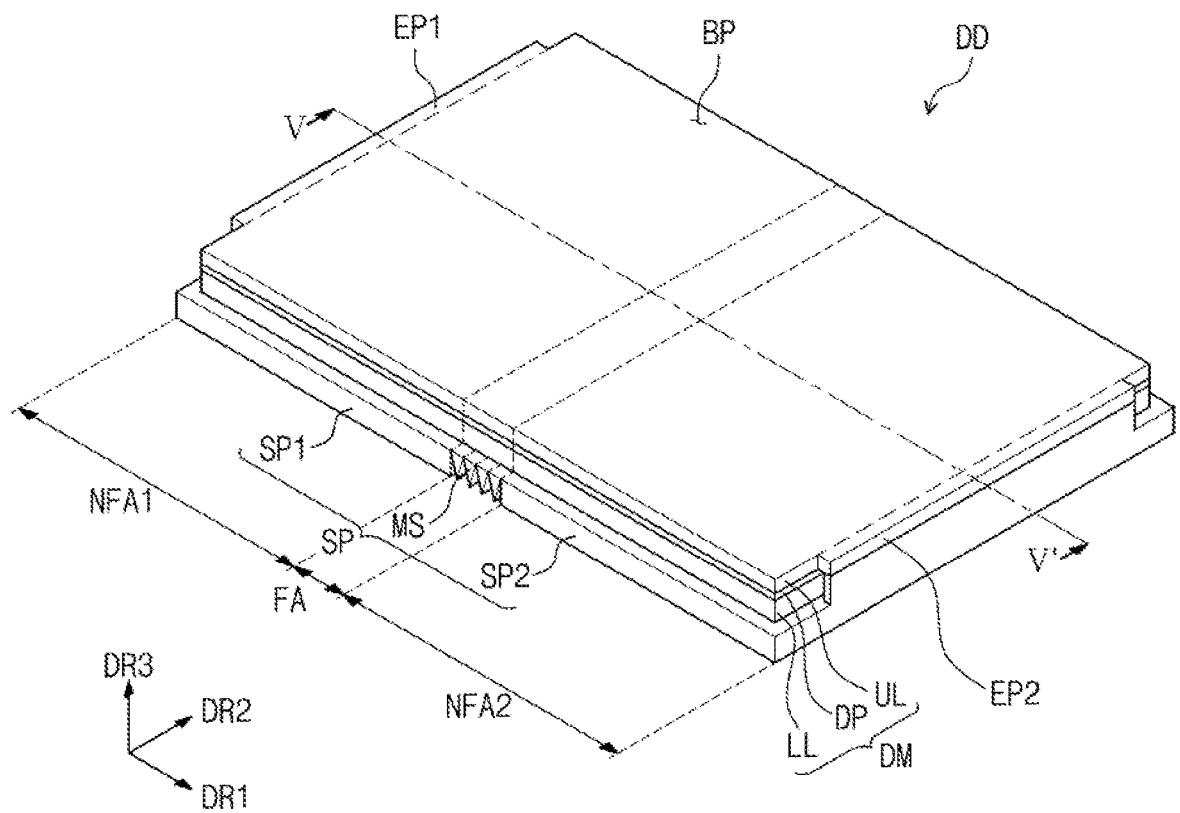
FIG. 8A is a perspective view of a display device according to an embodiment of the inventive concept.
Figure 8B:
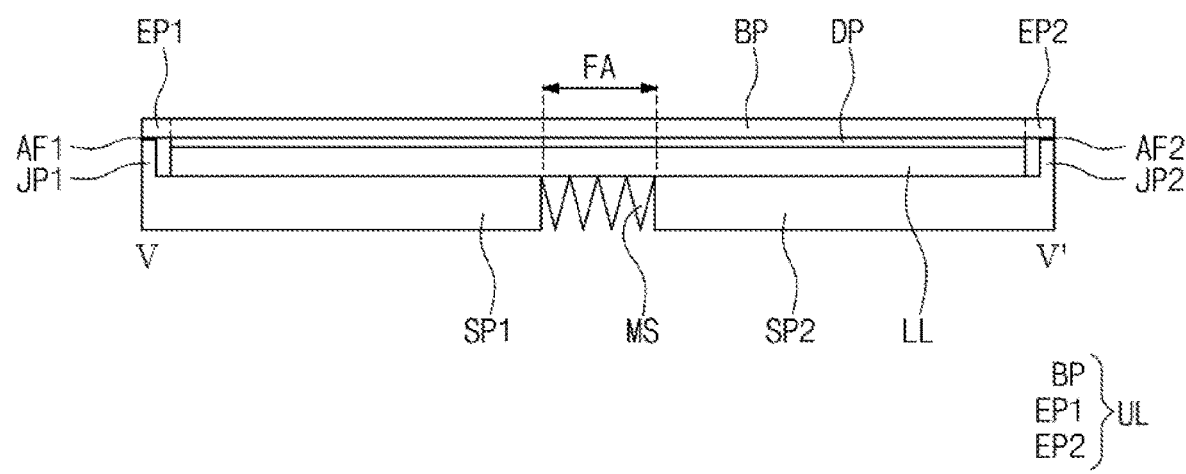
FIG. 8B is a cross-sectional view taken along line V-V' of FIG. 8A.

FIG. 8A is a perspective view of the display device according to an embodiment of the inventive concept, and FIG. 8B is a cross-sectional view taken along line V-V' of FIG. 8A. In FIGS. 8A and 8B, the same components as those of FIGS. 3A and 3B will be designated by the same reference numeral, and their detailed descriptions will be omitted.

Referring to FIGS. 8A and 8B, in the display device DD according to the exemplary embodiment of the inventive concept, the upper layer UL may include a body part BP and extension parts EP1 and EP2 extending from the body part BP. The body part BP may have a rectangular plate shape, and each of the extension parts EP1 and EP2 may extend from one side of the body part BP. In FIG. 8A, the extension parts EP1 and EP2 include a first extension part EP1 extending from a first short side and a second extension part EP2 extending from a second short side.

The first support plate SP1 faces the first extension part EP1. The first support plate SP1 includes a first support part SPP1 protruding from a top surface of the first support plate SP1. The first support part SPP1 may protrude from the top surface of the first support plate SP1 that does not overlap the display panel DP and the lower layer LL, and the top surface of the first support part SPP1 may face the rear surface of the first extension part EP1. The first adhesive film AF1 may be provided between the first support part SPP1 and the first extension part EP1. Therefore, the first extension part EP1 may be fixed to the top surface of the first support part SPP1 by the first adhesive film AF1.

The second support plate SP2 faces the second extension part EP2 and includes a second support part SPP2 protruding from a top surface of the second support plate SP2. The second support part SPP2 may protrude from the top surface of the second support plate SP2 that does not overlap the display panel DP and the lower layer LL, and the top surface of the second support part SPP2 may face the rear surface of the second extension part EP2. The second adhesive film AF2 may be provided between the second support part SPP2 and the second extension part EP2. Therefore, the second extension part EP2 may be fixed to the top surface of the second support part SPP2 by the second adhesive film AF2.

As described above, the first and second extension parts EP1 and EP2 of the upper layer UL are fixed to the first and second support plates SP1 and SP2, respectively, to prevent the edge of the upper layer UL from being pulled toward the folding area FA. Therefore, even though the folded state is maintained for a long time, the bending deformation may not occur in the upper layer UL on the folding area FA, or the degree of the deformation may be reduced.

Figure 9A:
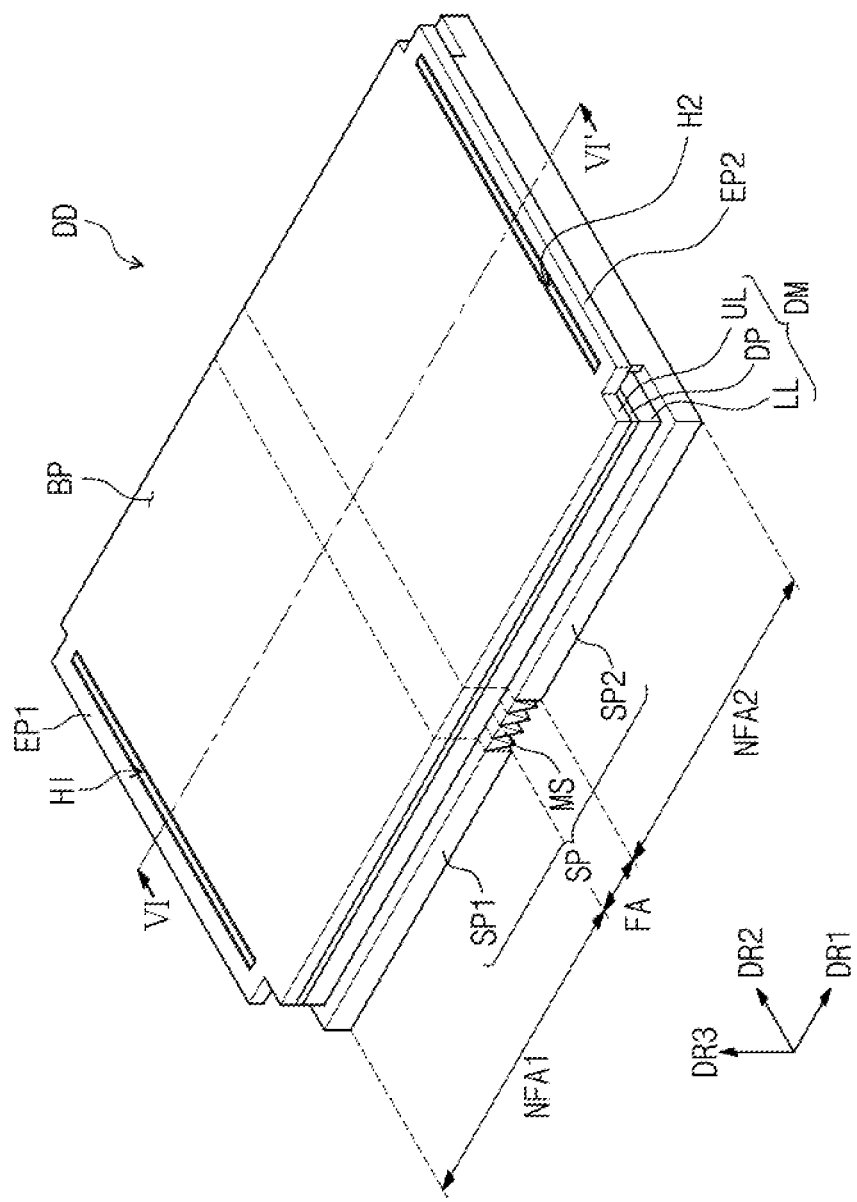
FIG. 9A is a perspective view of a display device according to an embodiment of the inventive concept.
Figure 9B:
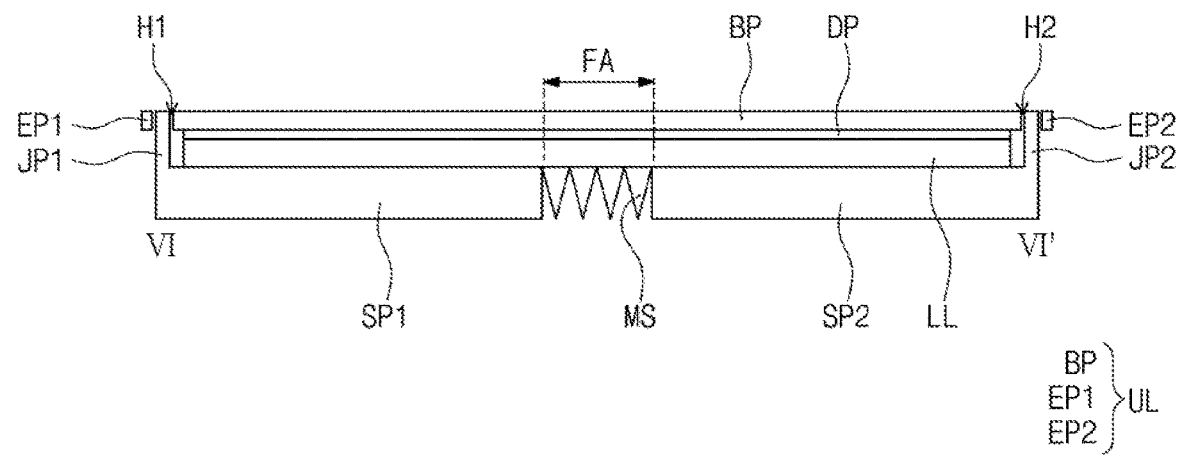
FIG. 9B is a cross-sectional view taken along line VI-VI' of FIG. 9A.
Figure 9C:
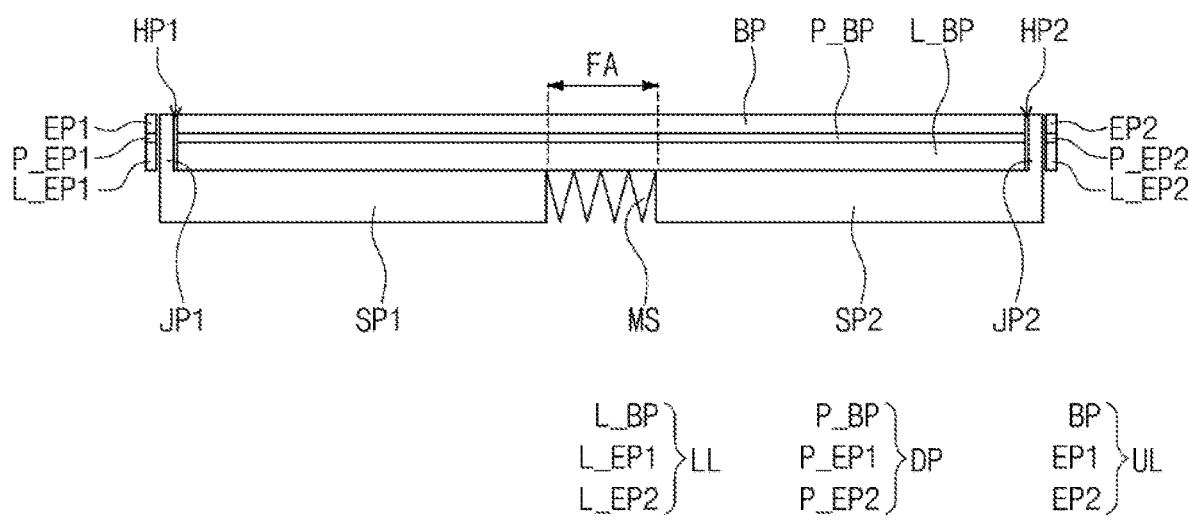
FIG. 9C is a cross-sectional view of a display device of FIG. 9A according to an embodiment of the inventive concept.

FIG. 9A is a perspective view of the display device according to an embodiment of the inventive concept, and FIG. 9B is a cross-sectional view taken along line VI-VI' of FIG. 9A. FIG. 9C is a cross-sectional view of the display device of FIG. 9A, according to an embodiment of the inventive concept. In FIGS. 9A to 9C, the same components as those of FIGS. 8A and 8B will be designated by the same reference numeral, and their detailed descriptions will be omitted.

Referring to FIGS. 9A and 9B, in the display device DD according to the exemplary embodiment of the inventive concept, the upper layer UL may include a body part BP and an extension parts EP1 and EP2 extending from the body part BP. In FIG. 9A, the extension parts EP1 and EP2 include a first extension part EP1 extending from a first short side of the body part BP and a second extension part EP2 extending from a second short side of the body part BP. A first fixing hole H1 is defined in the first extension part EP1, and a second fixing hole H2 is defined in the second extension part EP2.

The first support plate SP1 includes a first jig part JP1 protruding from a top surface of the first support plate SP1. The first jig part JP1 may protrude from the top surface of the first support plate SP1 that does not overlap the display panel DP and the lower layer LL. The first jig part JP1 may be inserted into the first fixing hole H1 of the first extension part EP1. Therefore, the first extension part EP1 may be fixed to the first support plate SP1 by inserting the first jig part JP1 into the first fixing hole H1.

The second support plate SP2 includes a second jig part JP2 protruding from a top surface of the second support plate SP2. The second jig part JP2 may protrude from the top surface of the second support plate SP2 that does not overlap the display panel DP and the lower layer LL. The second jig part JP2 may be inserted into the second fixing hole H2 of the second extension part EP2. Therefore, the second extension part EP2 may be fixed to the second support plate SP2 by inserting the second jig part JP2 into the second fixing hole H2.

As described above, the first and second extension parts EP1 and EP2 of the upper layer UL are fixed to the first and second support plates SP1 and SP2, respectively, to prevent the edge of the upper layer UL from being pulled toward the folding area FA. Therefore, even though the folded state is maintained for a long time, the bending deformation may not occur in the upper layer UL on the folding area FA, or the degree of the deformation may be reduced.

At least one of the display panel DP and the lower layer LL may include extension parts corresponding to the first and second extension parts EP1 and EP2. As illustrated in FIG. 9C, the display panel DP may include a panel body part P_BP and panel extension parts P_EP1 and P_EP2 extending from the panel body part P_BP. The panel extension parts P_EP1 and P_EP2 may include first and second panel extension parts P_EP1 and P_EP2 provided to correspond to the first and second extension parts EP1 and EP2, respectively. Additionally or alternatively, holes may be defined in the first and second panel extension parts P_EP1 and P_EP2 corresponding to the first and second fixing holes H1 and H2 (see FIG. 9B).

The lower layer LL may include a lower body part L_BP and lower extension parts L_EP1 and L_EP2 extending from the lower body part L_BP. The lower extension parts L_EP1 and L_EP2 may include first and second lower extension parts L_EP1 and L_EP2 provided to correspond to the first and second extension parts EP1 and EP2, respectively. Holes may be defined in the first and second lower extension parts L_EP1 and L_EP2 corresponding to the first and second fixing holes H1 and H2, respectively.

Therefore, a first hole part HP1 into which the first jig part JP1 is inserted is defined by the hole defined in each of the first extension part EP1, the first panel extension part P_EP1, and the first lower extension part L_EP1. A second hole part HP2 into which the second jig part JP2 is inserted may be defined by the hole defined in each of the second extension part EP2, the second panel extension part P_EP2, and the second lower extension part L_EP2. The upper layer UL, the lower layer LL, and both sides of the display panel DP may be fixed to the first and second support plates SP1 and SP2 since the first jig part JP1 is inserted into the first hole part HP1, and the second jig part JP2 is inserted into the second hole part HP2.

As a result, the edge of each of the upper layer UL, the lower layer LL, and the display panel DP may be prevented from being pulled toward the folding area FA. Therefore, even if the folded state is maintained for a long time, the bending deformation may not occur in the upper layer UL, the lower layer LL, and the display panel DP on the folding area FA, or the degree of the bending deformation may be reduced.

Figure 10A:
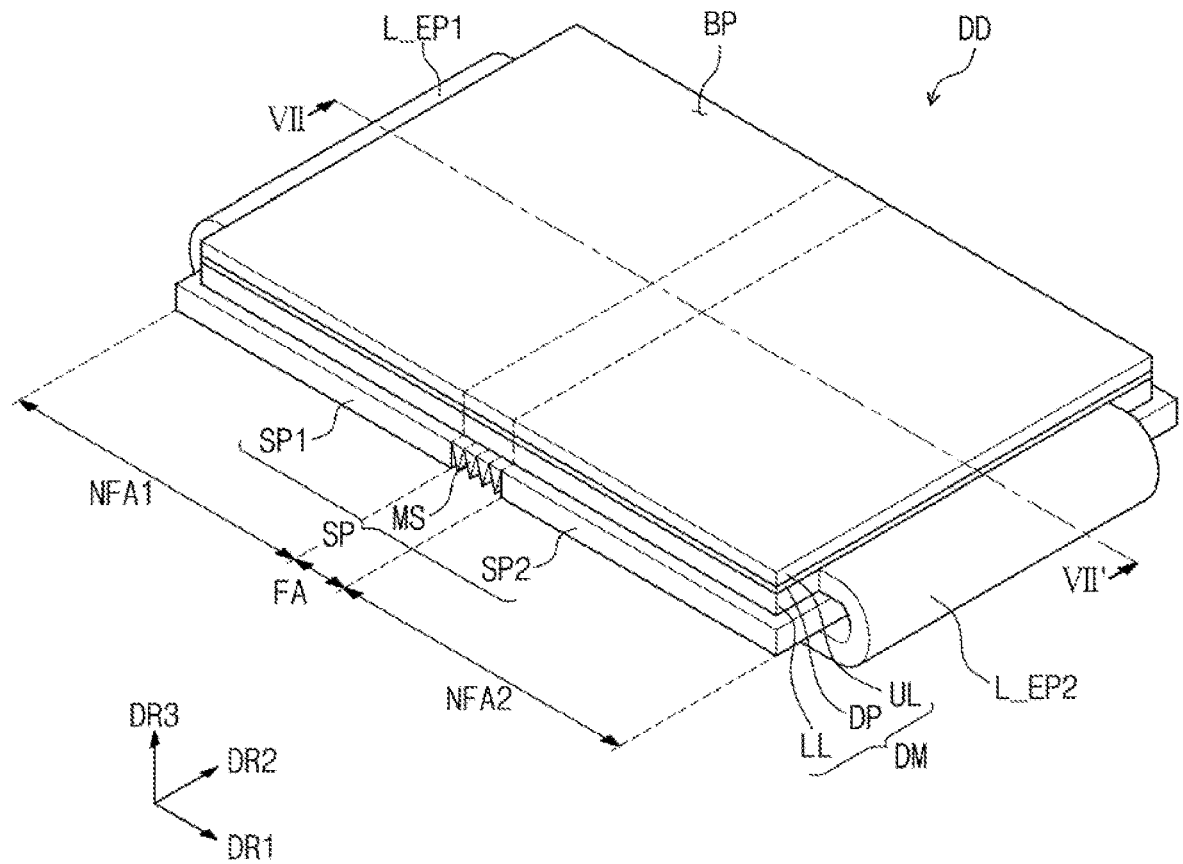
FIG. 10A is a perspective view of a display module according to an embodiment of the inventive concept.
Figure 10B:
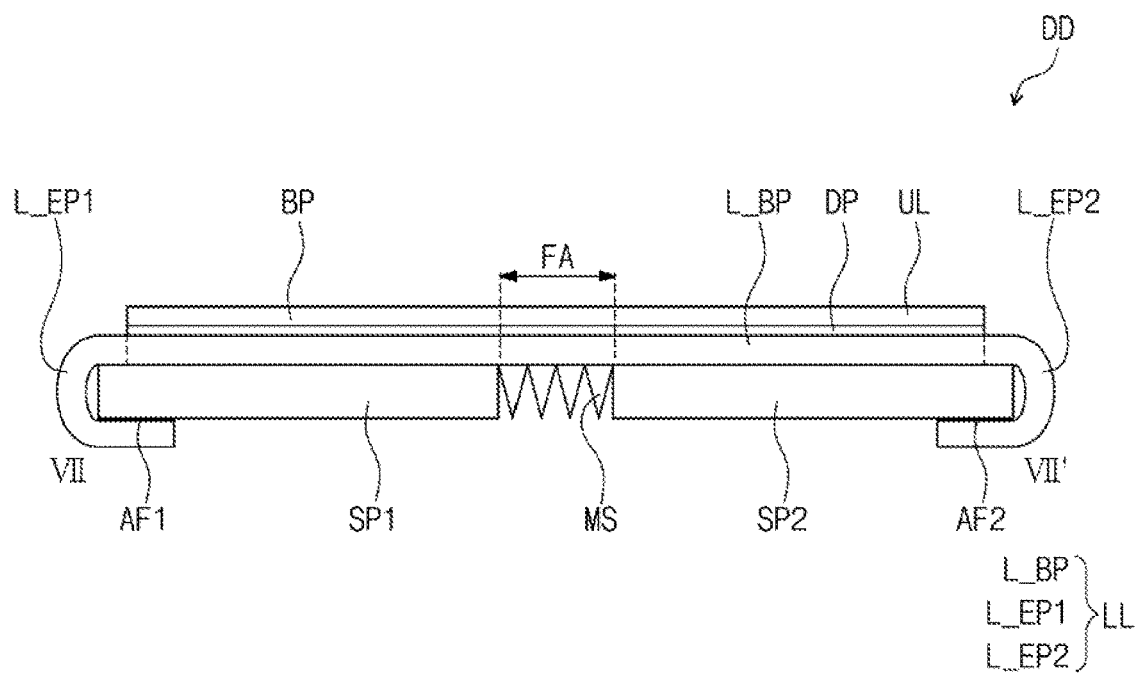
FIG. 10B is a cross-sectional view taken along line VII-VII' of FIG. 10A.
Figure 10C:
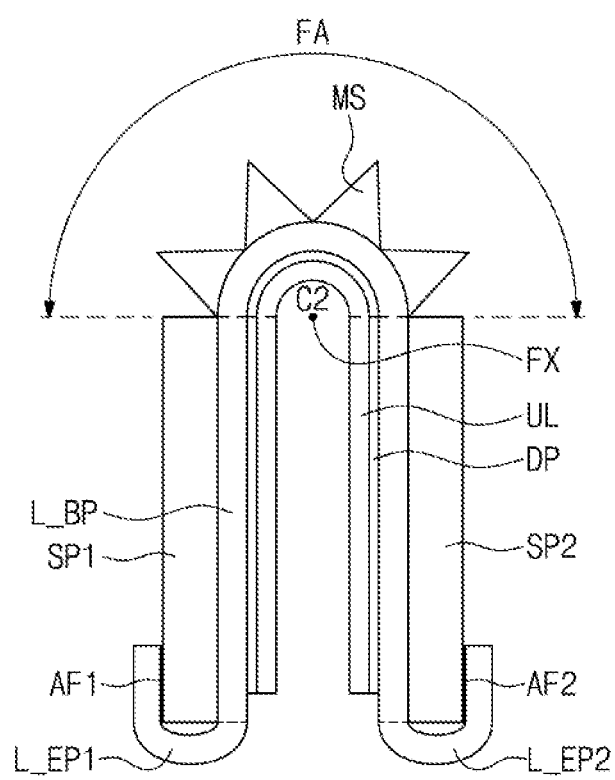
FIG. 10C is a cross-sectional view of the display device in a folded state.

FIG. 10A is a perspective view of the display module according to an embodiment of the inventive concept, and FIG. 10B is a cross-sectional view taken along line VII-VII' of FIG. 10A. FIG. 10C is a cross-sectional view of the display device in a folded state.

Referring to FIGS. 10A to 10C, in the display device DD according to an embodiment of the inventive concept, the lower layer LL may include a lower body part L_BP and lower extension parts L_EP1 and L_EP2 extending from the lower body part L_BP. In FIG. 10A, the lower extension parts L_EP1 and L_EP2 include a first lower extension part L_EP1 extending from a first short side of the lower body part L_BP and a second lower extension part L_EP2 extending from a second short side of the lower body part L_BP.

The first lower extension part L_EP1 may be bent from the lower body part L_BP so that one end of the first lower extension part L_EP1 is disposed on the rear surface of the first support plate SP1. The second lower extension part L_EP2 may be bent from the lower body part L_BP so that one end of the second lower extension part L_EP2 is disposed on the rear surface of the second support plate SP2.

The first adhesive film AF1 may be disposed between the first lower extension part L_EP1 and the rear surface of the first support plate SP1, and the second adhesive film AF2 may be disposed between the second lower extension part L_EP2 and the rear surface of the second support plate SP2. Accordingly, the first lower extension part L_EP1 is coupled to the rear surface of the first support plate SP1 by the first adhesive film AF1, and the second lower extension part L_EP2 is coupled to the rear surface of the second support plate SP2 by the second adhesive film AF2.

FIGS. 10A to 10C illustrate a structure in which the lower layer LL includes the first and second lower extension parts L_EP1 and L_EP2. The layers constituting the lower layer LL include the first and second lower extension parts L_EP1 and L_EP2. Alternatively, at least one of the plurality of layers constituting the lower layer LL includes the first and second lower extension parts L_EP1 and L_EP2. For example, each of the base layer BSL (see FIG. 3D) and the cover panel CP (see FIG. 3D) constituting the lower layer LL may include the first and second lower extension parts L_EP1 and L_EP2. For another example, at least one layer of the base layer BSL and the cover panel CP may include the first and second lower extension parts L_EP1 and L_EP2. For example, the base layer BSL of the lower layer LL may include the first and second lower extension parts L_EP1 and L_EP2.

As illustrated in FIG. 10C, the folding area FA of the display device DD may be in-folded with respect to the folding axis FX passing through the folding center C2. The display device DD may be folded so the display surfaces DS of the display module DM face each other.

In the in-folded state, the lower layer LL disposed at a position far from the folding center C2 among the display modules DM has a larger curvature radius than that of the upper layer UL close to the folding center C2. Therefore, the lower layer LL has a large deformation degree due to the folding. A drooping or bending phenomenon of a portion of the lower layer LL on the folding area FA may occur when the folded state is maintained for a long time.

However, an edge of the lower layer LL may not be pushed toward the folding center C2 by restriction force of the first and second support plates SP1 and SP2 when the first and second lower extension parts L_EP1 and L_EP2 are fixed to the first and second support plates SP1 and SP2, respectively. Therefore, even though the folded state is maintained for a long time, the bending deformation may not occur in the lower layer LL on the folding area FA, or the degree of the deformation may be reduced.

Figure 11A:
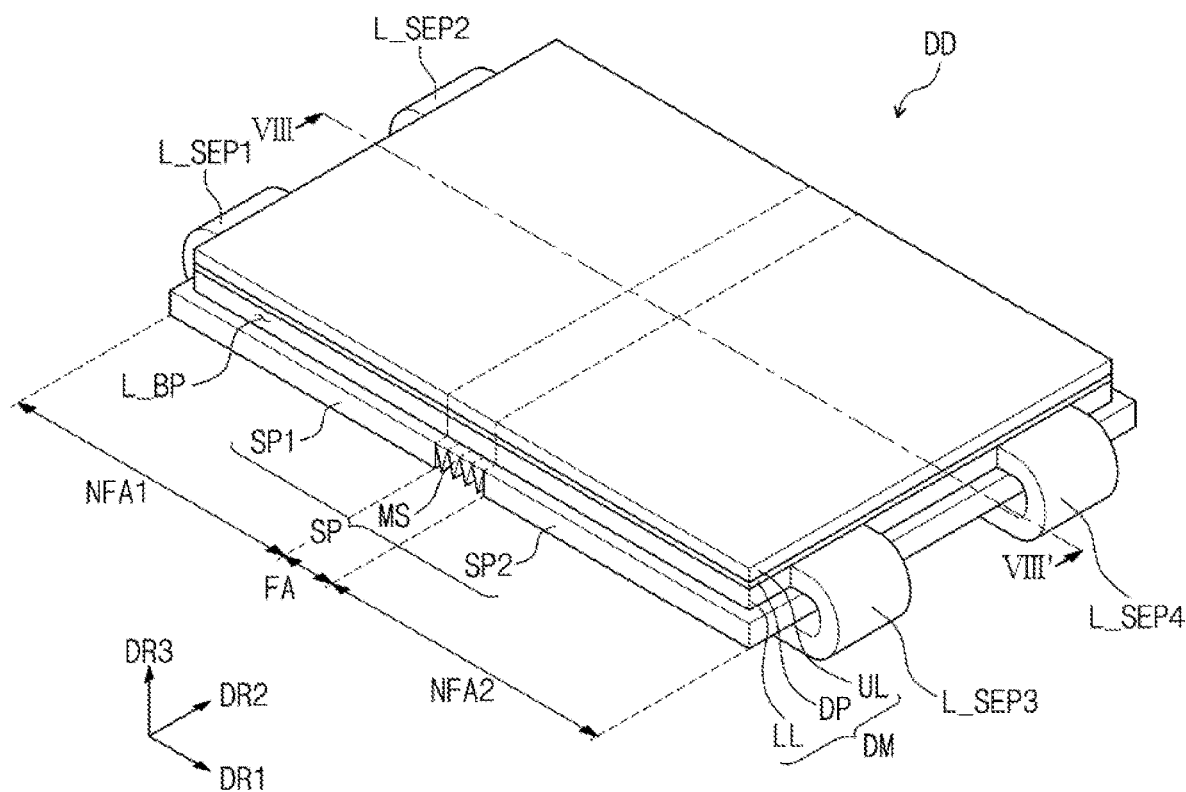
FIG. 11A is a perspective view of a display device according to an embodiment of the inventive concept.
Figure 11B:
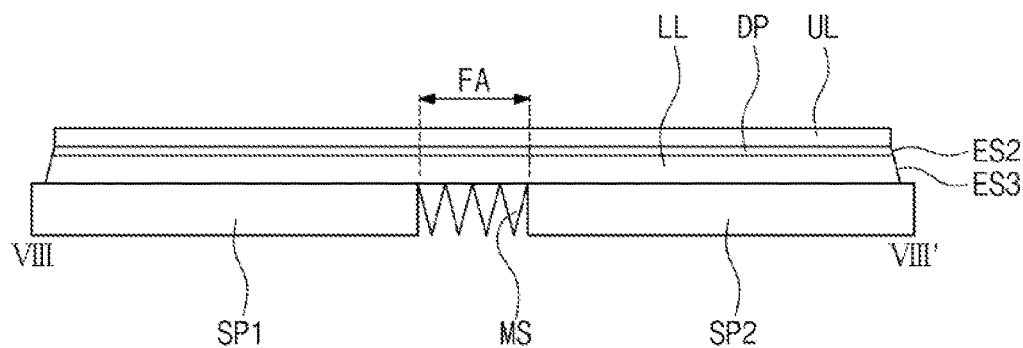
FIG. 11B is a cross-sectional view taken along line VIII-VIII' of FIG. 11A.

FIG. 11A is a perspective view of the display device according to an embodiment of the inventive concept, and FIG. 11B is a cross-sectional view taken along line VIII-VIII' of FIG. 11A.

Referring to FIGS. 11A and 11B, the lower layer LL may include a lower body part L_BP and lower extension parts L_SEP1, L_SEP2, L_SEP3, and L_SEP4 extending from the lower body part L_BP. The lower extension parts L_SEP1, L_SEP2, L_SEP3, and L_SEP4 may extend from one side of the lower body part L_BP. In FIG. 11A, the lower extension parts L_SEP1, L_SEP2, L_SEP3, and L_SEP4 include first and second lower extension parts L_SEP1 and L_SEP2 extending from first short sides of the lower body part L_BP and third and fourth lower extension parts L_SEP3 and L_SEP4 extending from second short sides.

The first and second lower extension parts L_SEP1 and L_SEP2 may be bent from the lower body part L_BP, and the third and fourth lower extension parts L_SEP3 and L_SEP4 may be bent from the lower body part L_BP. Therefore, one end of each of the first and second lower extension parts L_SEP1 and L_SEP2 is disposed on the rear surface of the first support plate SP1, and one end of each of the third and fourth lower extension parts L_SEP3 and L_SEP4 is provided on the rear surface of the second support plate SP2.

The first and second lower extension parts L_SEP1 and L_SEP2 are coupled to the rear surface of the first support plate SP1 by an adhesive film, and the third and fourth lower extension parts L_SEP3 and L_SEP4 are coupled to the rear surface of the second support plate SP2 by an adhesive film.

As described above, the edge of the lower layer LL may be prevented from being pulled toward the folding area FA when the first to fourth lower extension parts L_SEP1 to L_SEP4 are fixed to the first and second support plates SP1 and SP2. Therefore, even though the folded state is maintained for a long time, the bending deformation may not occur in the lower layer LL on the folding area FA, or the degree of the deformation may be reduced.

Additionally, the edge of the lower layer LL may receive force pulled toward the rear surfaces of the first and second support plates SP1 and SP2 when the first to fourth lower extension parts L_SEP1 to L_SEP4 are fixed to the first and second support plates SP1 and SP2. Therefore, as illustrated in FIG. 11B, an end surface ES3 of the lower layer LL may be disposed outside the end surface ES2 of the display panel DP.

FIGS. 3A to 11B illustrate the structures in which the extension parts EP1 and EP2 are disposed from the sides parallel to the extending direction of the folding axis FX among the sides of the body part BP, but the embodiment of the inventive concept is not limited thereto. For example, the extending parts EP1 and EP2 may extend from the side perpendicular to the extending direction of the folding axis FX among the sides of the body part BP. Hereinafter, in FIGS. 12A to 14B, the structure in which the extension part extends from the side perpendicular to the extending direction of the folding axis FX among the sides of the body part BP will be described.

Figure 12A:
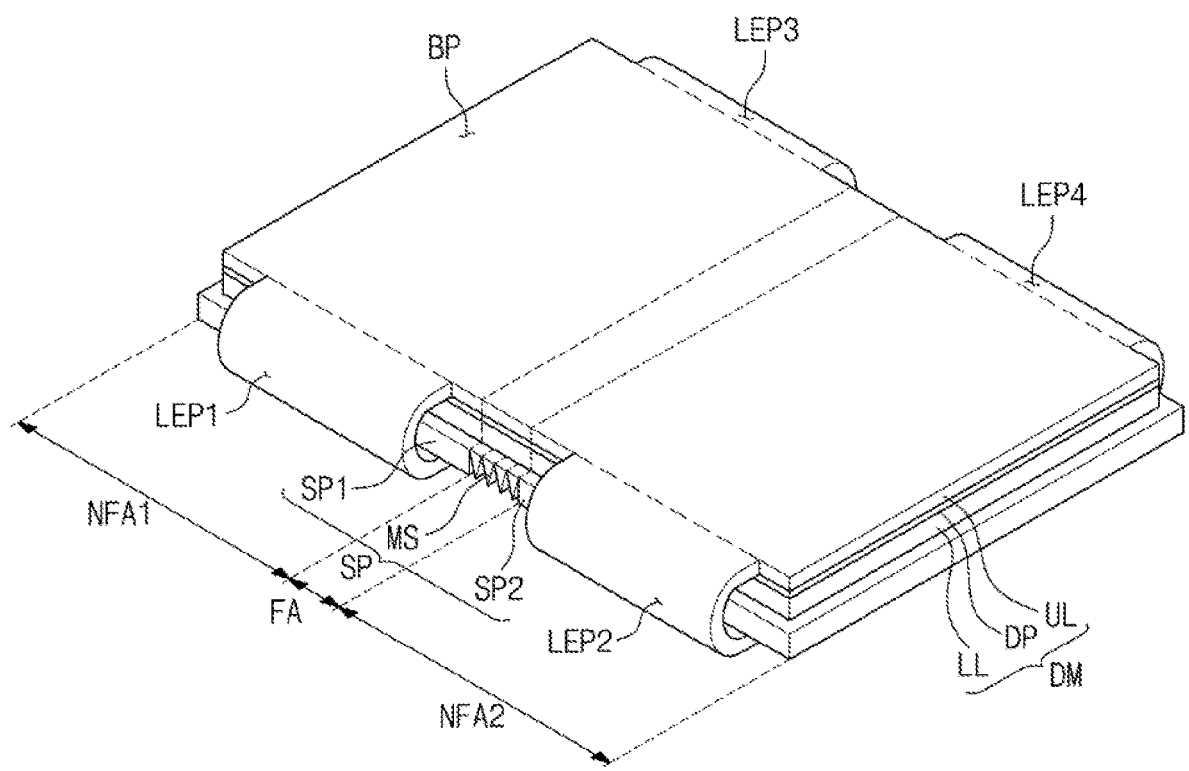
FIG. 12A is a perspective view of a display device according to an embodiment of the inventive concept.
Figure 12B:
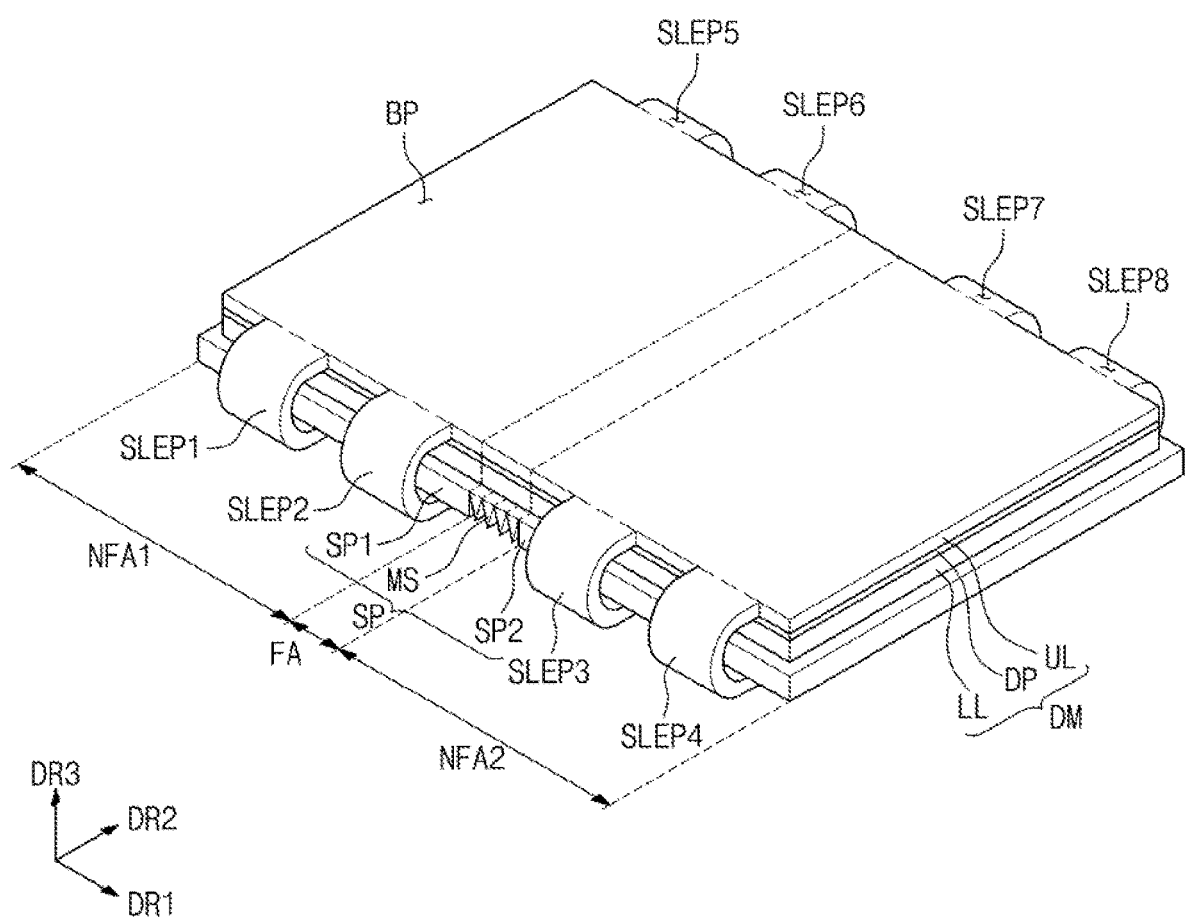
FIG. 12B is a perspective view of the display device according to an embodiment of the inventive concept.

FIG. 12A is a perspective view of the display device according to an embodiment of the inventive concept, and FIG. 12B is a perspective view of the display device according to an embodiment of the inventive concept.

Referring to FIG. 12A, in the display device according to an embodiment of the inventive concept, the upper layer UL includes a body part BP and extension parts LEP1, LEP2, LEP3, and LEP4 extending from the body part BP. The body part BP may have a square plate shape, and the extension parts LEP1, LEP2, LEP3, and LEP4 may extend from one side of the body part BP. In FIG. 12A, the extension parts LEP1, LEP2, LEP3, and LEP4 include first and second long side extension parts LEP1 and LEP2 extending from first long sides of the body part BP and third and fourth long side extension parts LEP3 and LEP4 extending from second long sides of the body part BP. The first and second long side extension parts LEP1 and LEP2 are spaced apart from each other with the folding area FA therebetween, and the third and fourth long side extension parts LEP3 and LEP4 are spaced apart from each other with the folding area FA therebetween.

The first and third long side extension parts LEP1 and LEP3 may be bent from the body part BP so that one end of each of the first and third long side extension parts LEP1 and LEP3 is disposed on the rear surface of the first support plate SP1. The second and fourth long side extension parts LEP2 and LEP4 may be bent from the body part BP so that one end of each of the second and fourth long side extension parts LEP2 and LEP4 is disposed on the rear surface of the second support plate SP2. Therefore, the first and third long side extension parts LEP1 and LEP3 are coupled to the rear surface of the first support plate SP1 by an adhesive film, and the second and fourth long side extension parts LEP2 and LEP4 are coupled to the rear surface of the second support plate SP2 by an adhesive film.

As illustrated in FIG. 12B, each of the first to fourth long side extension parts LEP1 to LEP4 may include two sub extension parts separated from each other. For example, the first long side extension part LEP1 may be divided into first and second sub extension parts SLEP1 and SLEP2, and the second long side extension part LEP2 may be divided into third and fourth sub extension parts SLEP3 and SLEP4. Similarly, the third long side extension part LEP3 may be divided into fifth and sixth sub extension parts SLEP5 and SLEP6, and the fourth long side extension part LEP4 may be divided into seventh and eighth sub extension parts SLEP7 and SLEP8.

The extension part is fixed to the support plate SP to prevent bending deformation from occurring in the upper layer UL on the folding area FA or reduce a degree of the bending deformation when the extension part is disposed from one side of the body part BP perpendicular to the extending direction of the folding axis FX.

Figure 13A:
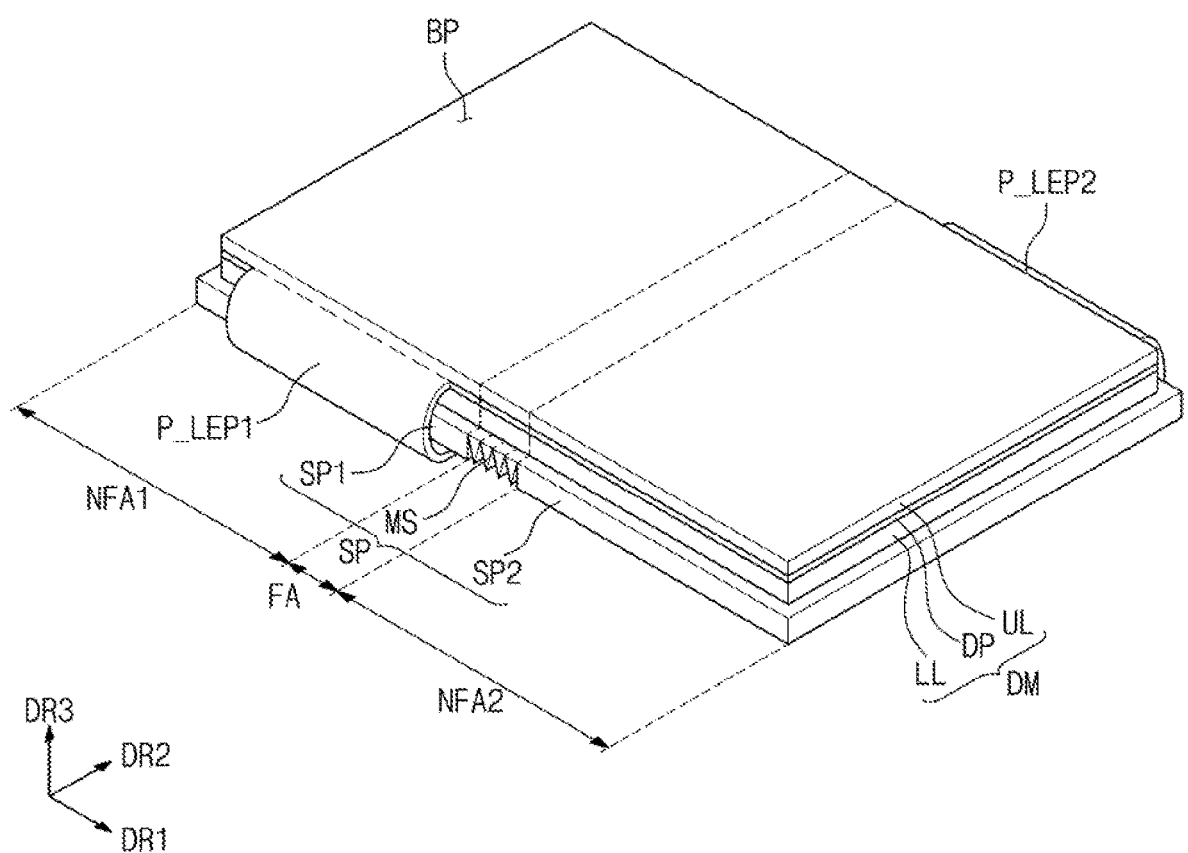
FIG. 13A is a perspective view of a display device according to an embodiment of the inventive concept.
Figure 13B:
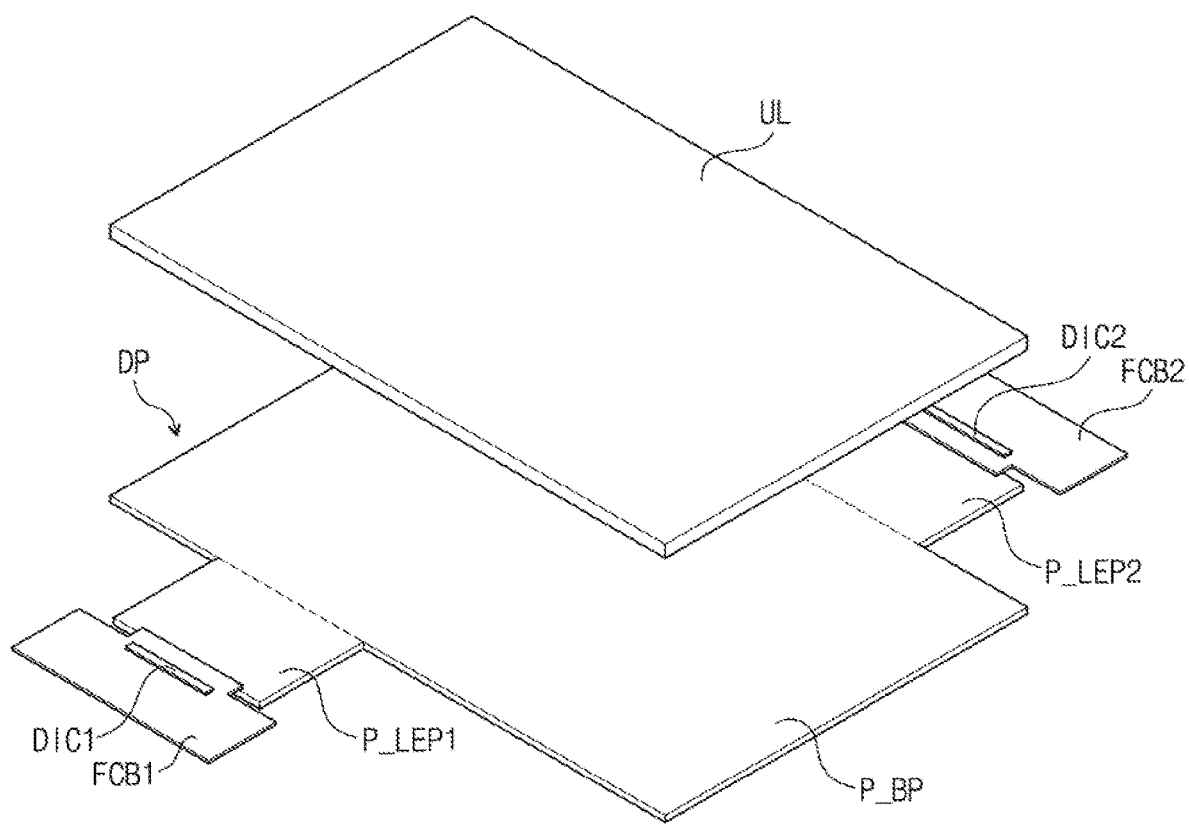
FIG. 13B is an exploded perspective view of a display panel and an upper layer of FIG. 13A.
Figure 13C:
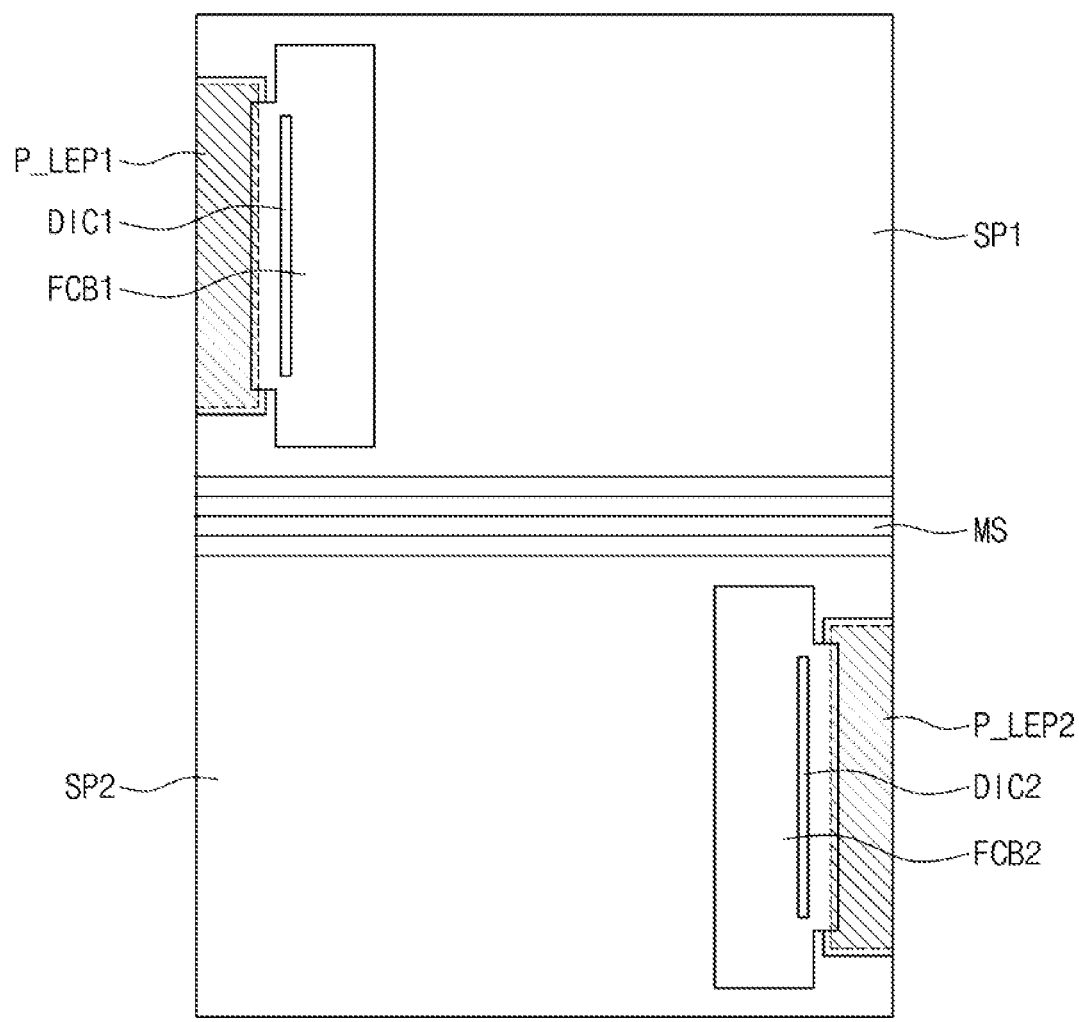
FIG. 13C is a bottom view of the display device of FIG. 13A.

FIG. 13A is a perspective view of the display device according to an embodiment of the inventive concept, FIG. 13B is an exploded perspective view of the display panel and the upper layer of FIG. 13A, and FIG. 13C is a bottom view of the display device of FIG. 13A.

Referring to FIGS. 13A to 13C, in the display device according to an embodiment, the display panel DP includes a panel body part P_BP and panel extension parts P_LEP1 and P_LEP2 extending from the panel body part P_BP. In FIGS. 13A and 13B, the panel extension parts P_LEP1 and P_LEP2 include a first panel extension part P_LEP1 extending from a first long side of the panel body part P_BP and a second panel extension part P_LEP2 extending from a second long side of the panel body part P_BP. The first and second panel extension parts P_LEP1 and P_LEP2 may be disposed to be diagonally spaced apart from each other with the folding area FA therebetween.

The first panel extension part P_LEP1 may be bent from the panel body part P_BP so one end of the first panel extension part P_LEP1 is disposed on the rear surface of the first support plate SP1. The second panel extension part P_LEP2 may be bent from the panel body part P_BP so one end of the second panel extension part P_LEP2 is disposed on the rear surface of the second support plate SP2. Therefore, the first panel extension part P_LEP1 is coupled to the rear surface of the first support plate SP1 by a third adhesive film AF3, and the second panel extension part P_LEP2 is coupled to the rear surface of the second support plate SP2 by a fourth adhesive film AF4.

Since descriptions of first and second flexible circuit boards FCB1 and FCB2 and first and second driving chips DIC1 and DIC2 are duplicated with those of the first and second flexible circuit boards FCB1 and FCB2 and the first and second driving chips DIC1 and DIC2 described with reference to FIGS. 6C and 6D, their descriptions will be omitted.

Figure 14A:
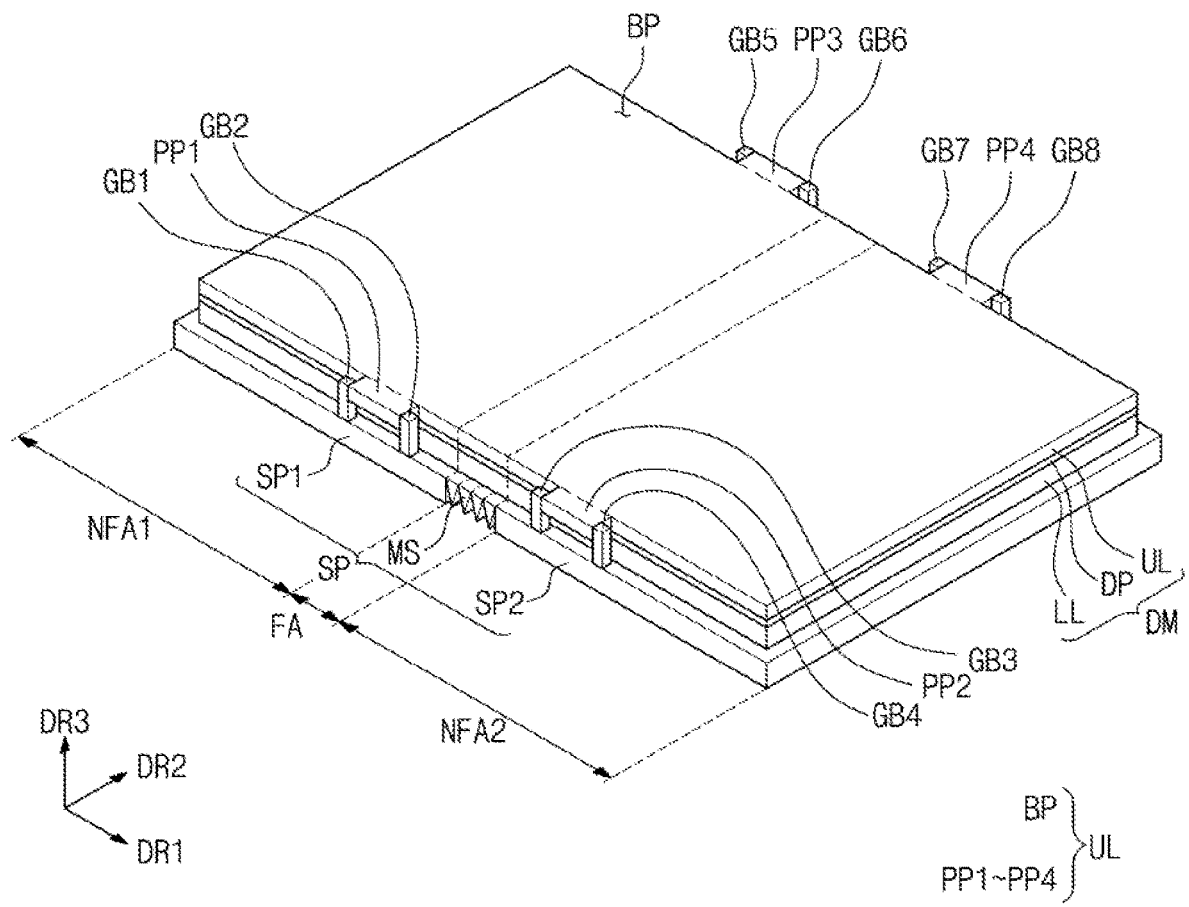
FIG. 14A is a perspective view of a display device according to an embodiment of the inventive concept.
Figure 14B:
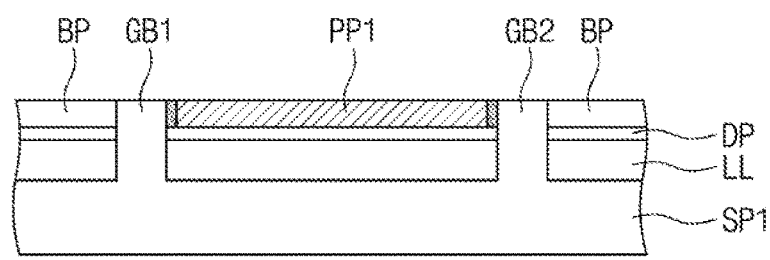
FIG. 14B is a partial side view of FIG. 14A.

FIG. 14A is a perspective view of the display device according to an embodiment of the inventive concept, and FIG. 14B is a partial side view of FIG. 14A.

Referring to FIGS. 14A and 14B, in the display device according to the embodiment, the upper layer UL may include a body part BP and extension parts PP1, PP2, PP3, and PP4 extending from the body part BP. In FIG. 14A, the extension parts PPI, PP2, PP3, and PP4 may include first and second protrusions PP1 and PP2 protruding from first long sides of the body part BP, and third and the forth protrusions PP3 and PP4 protruding from the second long sides. The first and second protrusions PP1 and PP2 are spaced apart from each other with the folding area FA therebetween. The third and fourth protrusions PP3 and PP4 are spaced apart from each other with the folding area FA therebetween.

The first support plate SP1 includes first and second guide bars GB1 and GB2 that are adjacent to the first long sides to protrude from the top surface of the first support plate SP1. Additionally, the first support plate SP1 includes fifth and sixth guide bars GB5 and GB6 that are adjacent to the second long sides to protrude from the top surface of the first support plate SP1. The first and second guide bars GB1 and GB2 and the fifth and sixth guide bars GB5 and GB6 protrude from the top surface of the first support plate SP1 that does not overlap the display panel DP and the lower layer LL.

The first and second guide bars GB1 and GB2 are spaced apart from each other in the first direction DR1. The fifth and sixth guide bars GB5 and GB6 are spaced apart from each other in the first direction DR1. The first protrusion PP1 is inserted between the first and second guide bars GB1 and GB2, and the third protrusion PP3 is inserted between the fifth and sixth guide bars GB5 and GB6.

The second support plate SP2 includes third and fourth guide bars GB3 and GB4 that are adjacent to the first long sides to protrude from the top surface of the second support plate SP2. Additionally, the second support plate SP2 includes seventh and eighth guide bars GB7 and GB8 that are adjacent to the second long sides to protrude from the top surface of the second support plate SP2. The third and fourth guide bars GB3 and GB4 and the seventh and eighth guide bars GB7 and GB8 protrude from the top surface of the second support plate SP2 that does not overlap the display panel DP and the lower layer LL.

The third and fourth guide bars GB3 and GB4 are spaced apart from each other in the first direction DR1. Additionally, the seventh and eighth guide bars GB7 and GB8 are spaced apart from each other in the first direction DR1. The second protrusion PP2 is inserted between the third and fourth guide bars GB3 and GB4, and the fourth protrusion PP4 is inserted between the seventh and eighth guide bars GB7 and GB8.

In FIG. 14B, the coupling relationship between the first and second guide bars GB1 and GB2 and the first protrusion PP1 is representatively illustrated. Additionally, the coupling relationship between the third and fourth guide bars GB3 and GB4 and the second protrusion PP2, the coupling relationship between the fifth and sixth guide bars GB5 and GB6 and the third protrusion PP3, and the coupling relationship between the seventh and eighth guide bars GB7 and GB8 and the fourth protrusion PP4 may also be the same as the coupling relationship between the first and second guide bars GB1 and GB2 and the first protrusion PP1.

Referring to FIG. 14B, a first adhesive film AF1 is provided between a sidewall of the first guide bar GB1 and a first side surface of the first protrusion PP1, and a second adhesive film AF2 is provided between a sidewall of the second guide bar GB2 and a second side surface of the first protrusion PP1. Therefore, the first protrusion PP1 may be fixed to the first and second guide bars GB1 and GB2 by the first and second adhesive films AF1 and AF2.

As described above, the first to fourth protrusions PP1 to PP4 of the upper layer UL are fixed to the first and second support plates SP1 and SP2 to prevent the edge of the upper layer UL from being pulled toward the folding area FA. Therefore, the bending deformation may not occur in the upper layer UL on the folding area FA, or the degree of the deformation may be reduced, even though the folded state is maintained for a long time.

Figure 15:
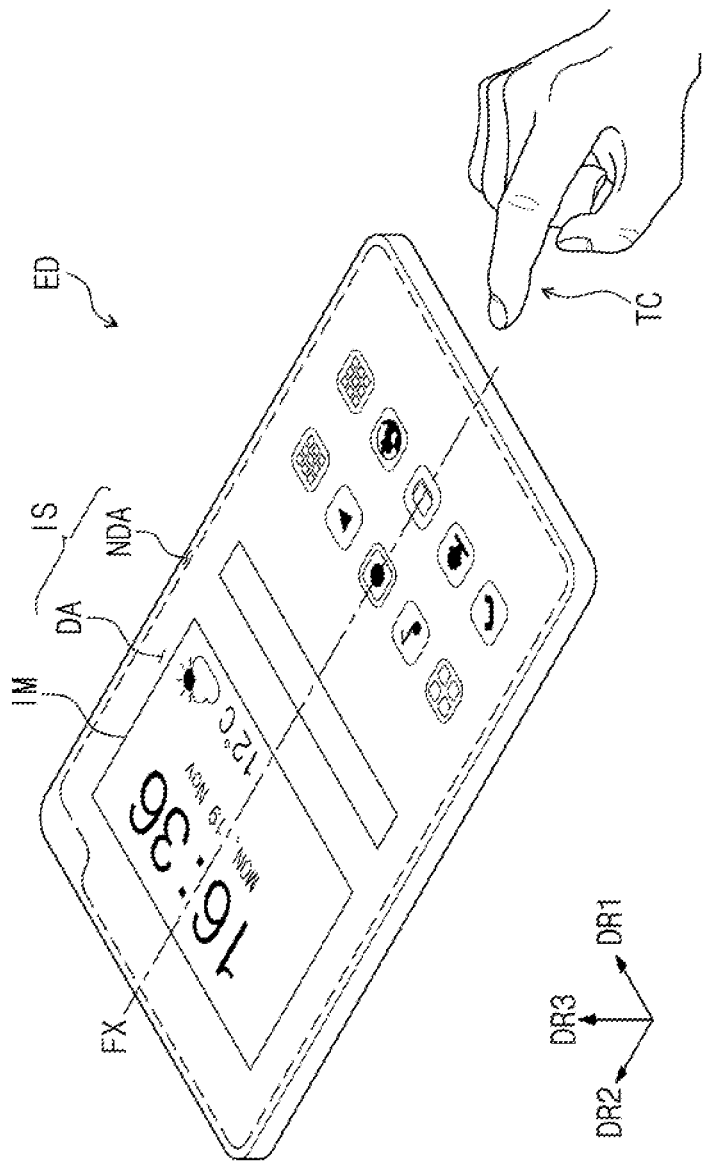
FIG. 15 is a perspective view of an electronic apparatus according to an embodiment of the inventive concept.
Figure 16A:
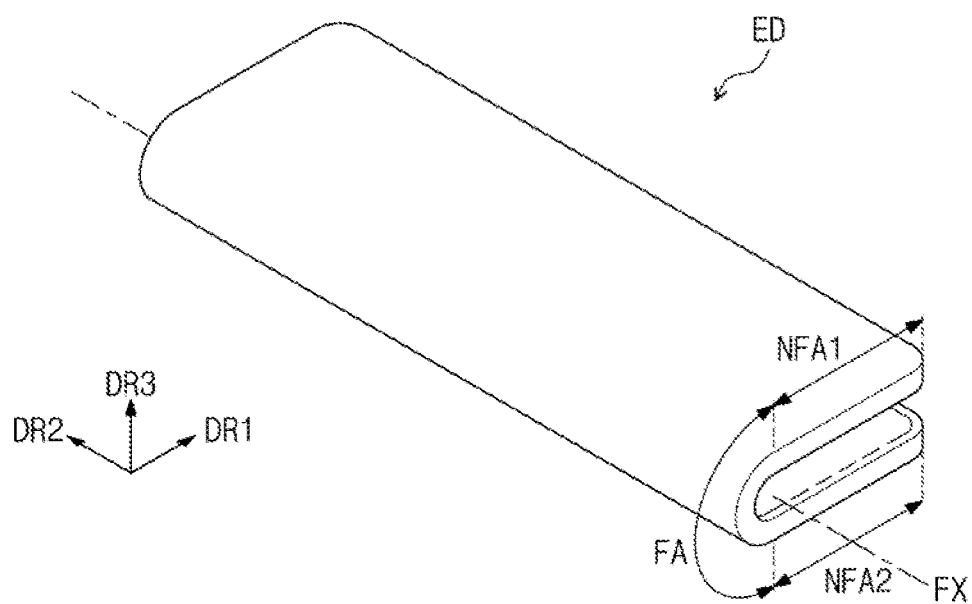
FIG. 16A is a view illustrating an in-folded state of the electronic apparatus of FIG. 15.
Figure 16B:
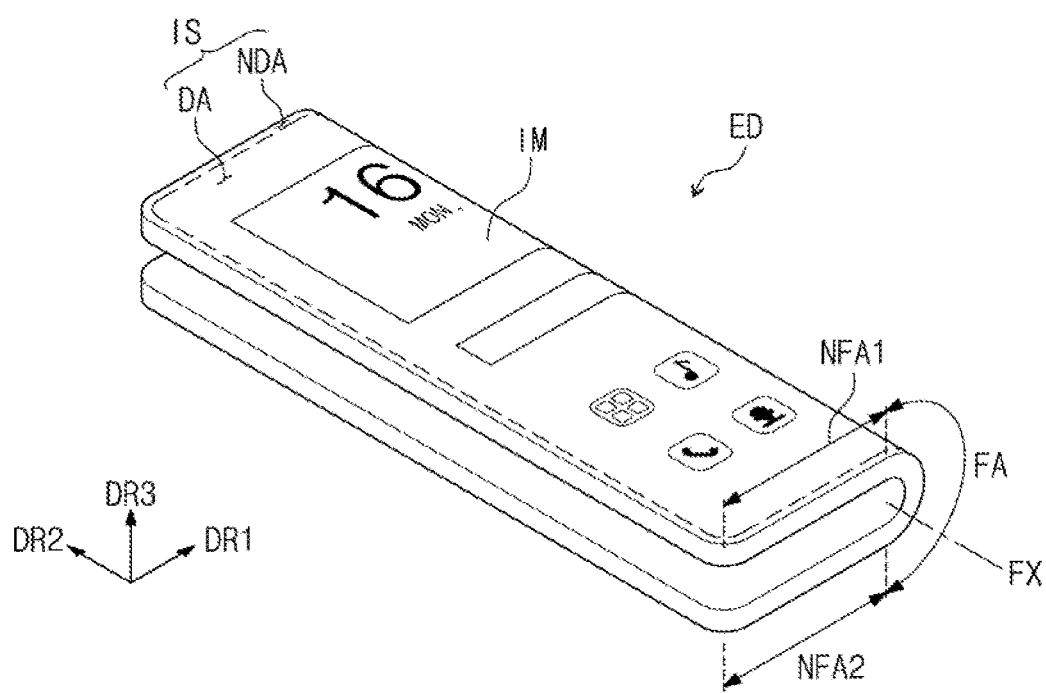
FIG. 16B is a view illustrating an out-folded state of the electronic apparatus of FIG. 15.

FIG. 15 is a perspective view of an electronic apparatus according to an embodiment of the inventive concept, FIG. 16A is a view illustrating an in-folded state of the electronic apparatus of FIG. 15, and FIG. 16B is a view illustrating an out-folded state of the electronic apparatus of FIG. 15.

Referring to FIG. 15, an electronic apparatus ED, according to an embodiment of the inventive concept, has a rectangular shape with short sides in the first direction DR1 and long sides in the second direction DR2 crossing the first direction DR1. However, the shape of the electronic apparatus ED is not limited thereto. For example, electronic apparatuses ED with various shapes may be provided.

The electronic apparatus ED may be a foldable electronic apparatus. Particularly, the electronic apparatus ED, according to an embodiment of the inventive concept, may be folded with respect to a folding axis FX extending in a predetermined direction. Hereinafter, a state that may be folded with respect to the folding axis FX may be defined as a folded state, and a state is not folded is defined as a non-folded state.

The folding axis FX may extend in the first direction DR1 or the second direction DR2. In an embodiment of the present disclosure, the folding axis FX extending in the second direction DR2 is illustrated, but is not limited thereto. The electronic apparatus ED may be folded with respect to the folding axis FX.

The electronic apparatus ED, according to the inventive concept, may be used for large-sized display devices such as televisions, monitors, and the like. Additionally, the electronic apparatus ED may be used for small and middle-sized display devices such as mobile phones, tablet PC, navigation units for vehicles, game consoles, and the like. The above-described equipment are exemplified as merely an exemplary embodiment. Therefore, the electronic apparatus ED may be adopted for other electronic equipment unless departing from the spirit and scope of the inventive concept.

As illustrated in FIG. 15, the electronic apparatus ED may display an image IM in the third direction DR3 on a display surface IS parallel to each of the first and second directions DR1 and DR2. The display surface IS of the electronic apparatus ED may be divided into a plurality of areas. A display area DA and a non-display area NDA may be defined on the display surface IS of the electronic apparatus ED.

The display area DA may be an area on which an image IM is displayed, and a user may see the image IM through the display area DA. The display area DA may have a rectangular shape. The non-display area NDA may surround the display area DA. Therefore, the shape of the display area DA may be substantially defined by the non-display area NDA. However, the embodiment of the inventive concept is merely an example. For example, the non-display area NDA may be disposed adjacent to one side of the display area DA or may be omitted. The electronic apparatus ED, according to an embodiment of the inventive concept, may be implemented according to various embodiments but is not limited to a specific embodiment.

The non-display area NDA is an area which is adjacent to the display area DA and on which the image IM is not displayed. A bezel area of the electronic apparatus ED may be defined by the non-display area NDA.

The electronic apparatus ED, according to the inventive concept, may sense a user's input TC applied from the outside. The user's input TC includes various types of external inputs such as a portion of user's body, light, heat, pressure, or the like. In this embodiment, the user's input TC is illustrated as a user's hand-applied to the front surface. However, this is merely an example. For example, as described above, the user's input TC may be provided in various shapes. The electronic apparatus ED may sense the user's input TC applied to a side surface or the rear surface of the electronic apparatus ED according to a structure of the electronic apparatus ED, but is not limited to a specific embodiment.

The electronic apparatus ED may activate the display surface IS to display the image IM and may sense the user's input TC. In this embodiment, an area on which the user's input TC is sensed may be provided on the display area DA on which the image IM is displayed. However, this is merely an example. For example, the area on which the user's input TC is sensed may be provided on the non-display area NDA or provided on an entire area of the display surface IS.

The electronic apparatus ED may be folded with respect to the folding axis FX. The electronic apparatus ED may be in-folded or out-folded. The electronic apparatus ED illustrated in FIG. 16A may be in-folded so the display surface IS of the first non-folding area NFA1 and the display surface IS of the second non-folding area NFA2 face each other. Referring to FIG. 16B, the electronic apparatus ED may be out-folded with respect to the folding axis FX. The display surface IS may be exposed to the outside when the electronic apparatus ED is out-folded.

Figure 17A:
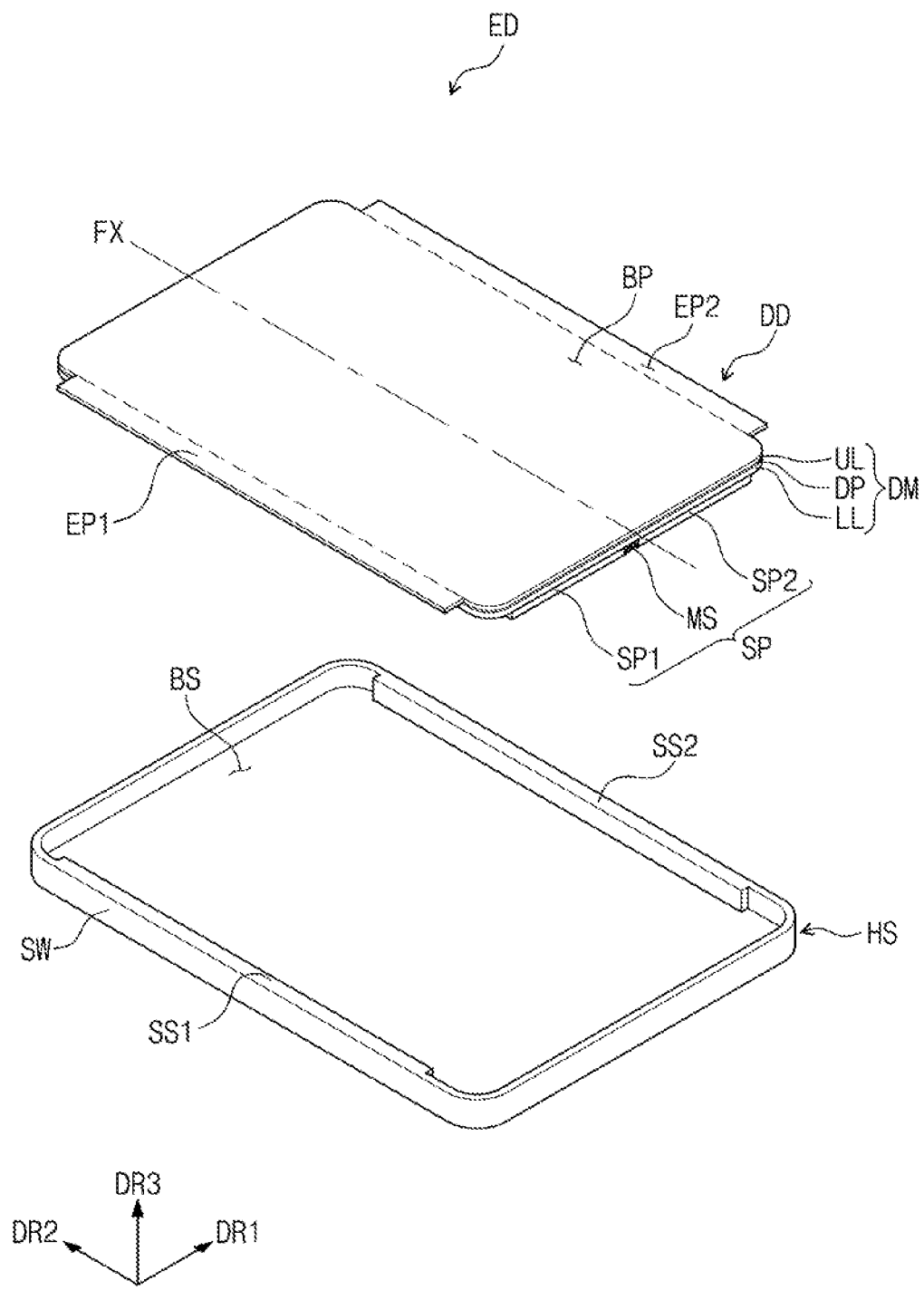
FIG. 17A is an exploded perspective view of the electronic apparatus of FIG. 15.
Figure 17B:
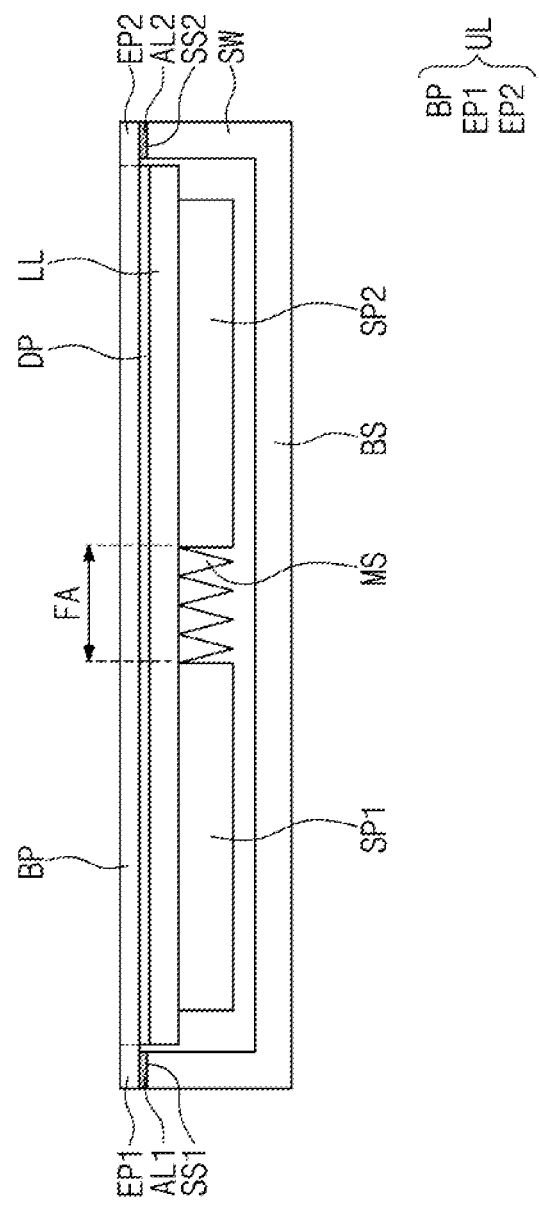
FIG. 17B is a cross-sectional view taken along line IX-IX' of FIG. 17A.

FIG. 17A is an exploded perspective view of the electronic apparatus of FIG. 15, and FIG. 17B is a cross-sectional view taken along line IX-IX' of FIG. 17A.

Referring to FIGS. 17A and 17B, the electronic apparatus ED includes a display device DD and a case HS.

The display device DD includes a display module DM and a support plate SP. The display module DM includes a display panel DP, an upper layer UL disposed above the display panel DP, and a lower layer LL disposed below the display panel DP.

The upper layer UL may include a body part BP and extension parts EP1 and EP2 extending from the body part BP. The body part BP may have a rectangular plate shape, and each of the extension parts EP1 and EP2 may extend from one side of the body part BP. In FIG. 17A, the extension parts EP1 and EP2 include a first extension part EP1 and a second extension part EP2 that respectively extend from the first and second long sides extending in the second direction DR2.

In FIGS. 17A and 17B, the upper layer UL has the extension part EP1 and EP2. Alternatively, at least one of the display panel DP and the lower layer LL may have the extension parts as well as the upper layer UL.

The support plate SP is disposed on a rear surface of the display module DM to support the display module DM. Since the support plate SP has a structure similar to that of the support plate SP illustrated in FIGS. 3A and 3B, duplicated description thereof will be omitted.

The case HS covers the display device DD and may include a bottom surface BS and a sidewall SW extending from the bottom surface BS. Additionally, the display device DD may be accommodated in an internal space defined by the bottom surface BS and the sidewall SW. Although not shown in the drawings, other components constituting the electronic apparatus ED may be accommodated in the case HS.

The case HS may include a material with relatively high rigidity. For example, the case HS may include a plurality of frames and/or plates, which are made of glass, plastic, or a metal. The case HS may protect the constituents of the electronic apparatus ED, which are accommodated in the internal space, against an external impact.

The case HS may include first and second top surfaces SS1 and SS2 facing the first and second extension parts EP1 and EP2, respectively. The first and second top surfaces SS1 and SS2 may be defined on the sidewall SW of the case HS.

Each of the first and second top surfaces SS1 and SS2 may have a width greater than the other top surfaces of the sidewall SW to be coupled to the first and second extension parts EP1 and EP2.

The first and second extension parts EP1 and EP2 may be disposed on the first and second top surfaces SS1 and SS2 when the display device DD is accommodated in the case HS. As illustrated in FIG. 17B, a first adhesive film AL1 is disposed between the first extension part EP1 and the first top surface SS1. Additionally, a second adhesive film AL2 is disposed between the second extension part EP2 and the second top surface SS2.

Therefore, the first extension part EP1 is coupled to the first top surface SS1 of the case HS by the first adhesive film AL1. Additionally, the second extension part EP2 is coupled to the second top surface SS2 of the case HS by the second adhesive film AL2.

As described above, the first and second extension parts EP1 and EP2 of the upper layer UL are fixed to the case HS to prevent an edge of the upper layer UL from being pulled toward the folding area FA. Therefore, even though the folded state is maintained for a long time, the bending deformation may not occur in the upper layer UL on the folding area FA, or the degree of the deformation may be reduced.

Additionally, the lower layer LL may be coupled to the case HS instead of the upper layer UL according to the folding method. In this case, the coupling method of the lower layer LL and the case HS may be similar to the coupling method of the upper layer UL and the case HS.

According to the embodiment of the inventive concept, the at least one extension part of the upper layer provided above the display panel and the lower layer provided below the display panel may be coupled to the support plate or the case to prevent the bending deformation of the display module on the folding area from occurring by the restriction force therebetween or reduce the degree of the bending deformation.

It will be apparent to those skilled in the art that various modifications and variations can be made in the inventive concept. Therefore, it is intended that the present disclosure covers the modifications and variations of this invention provided the modifications and variations come within the scope of the appended claims and their equivalents. Therefore, to the maximum extent allowed by law, the scope of the present disclosure is to be determined by the broadest permissible interpretation of the following claims and their equivalents, and shall not be restricted or limited by the foregoing detailed description.

What is claimed is:

1. A display device comprising:
   a display module comprising a display panel on which a folding area configured to fold with respect to a folding axis and a plurality of non-folding areas adjacent to two opposite sides of the folding area are defined on a plane, and an upper layer disposed above the display panel; and
   a support plate disposed on a rear surface of the display module,
   wherein an extension part of the upper layer is coupled to the support plate.

2. The display device of claim 1, wherein the display module further comprises:
   a lower layer disposed below the display panel between the display panel and the support plate.

3. The display device of claim 2, wherein the display module is configured to fold so that a display surface of the display panel is exposed.

4. The display device of claim 3, wherein the upper layer comprises a body part, and
   wherein the extension part extends from the body part.

5. The display device of claim 4, wherein the extension part of the upper layer is curved to face a rear surface of the support plate opposite the display module, and
   the rear surface of the support plate and the extension part are coupled to each other by an adhesive film.

6. The display device of claim 4, wherein the support plate comprises a top surface facing the rear surface of the display module and a support part protruding from the top surface.

7. The display device of claim 6, wherein the extension part of the upper layer and the support part are coupled to each other by an adhesive film.

8. The display device of claim 4, wherein a hole is defined in the extension part of the upper layer, and
   the support plate comprises a top surface facing the rear surface of the display module and a jig part extending from the top surface so as to be inserted into the hole.

9. The display device of claim 4, wherein, an end surface of the body part is disposed outside an end surface of the display panel by coupling tensile force between the upper layer and the support plate during non-folding.

10. The display device of claim 3, wherein the display panel comprises:
    a panel body part; and
    a panel extension part extending from the panel body part so as to be coupled to the support plate.

11. The display device of claim 10, wherein the panel extension part is bent from the panel body part to face a rear surface of the support plate, and
    the rear surface of the support plate and the panel extension part are coupled to each other by an adhesive film.

12. The display device of claim 10, wherein the extension part of the upper layer is bent to face a rear surface of the support plate, and
    the panel extension part is bent to face the rear surface of the support plate.

13. The display device of claim 12, wherein the extension part of the upper layer and the panel extension part are coupled to the support plate at positions different from each other.

14. The display device of claim 2, wherein the display module is folded so that a display surface of the display panel disposed on the non-folding areas faces the display module, and
    the lower layer is coupled to the support plate.

15. The display device of claim 14, wherein the lower layer comprises a base layer and a cover panel, and
    the base layer and the cover panel are disposed between the display panel and the support plate.

16. The display device of claim 15, wherein the base layer comprises a lower body part, and
    a lower extension part extending from the lower body part.

17. The display device of claim 16, wherein the lower extension part is bent to face a rear surface of the support plate, and
    the rear surface of the support plate and the lower extension part are coupled to each other by an adhesive film.

18. The display device of claim 16, wherein an end surface of the lower body part is disposed outside an end surface of the display panel by coupling tensile force between the lower layer and the support plate during non-folding.

19. A display device comprising:
a display panel which displays an image and on which a folding area folded with respect to a folding axis and a plurality of non-folding area adjacent to both sides of the folding area are defined on a plane;
a window disposed above the display panel;
a base layer disposed below the display panel; and
a support plate disposed below the base layer,
wherein the window comprises:
a body part; and
an extension part extending from the body part and coupled to the support plate.

20. The display device of claim 19, wherein the display panel comprises:
a panel body part; and
a panel extension part extending from the panel body part and curved from the panel body part so as to be coupled to a rear surface of the support plate.

21. The display device of claim 20, wherein the extension part of the window is curved to face the rear surface of the support plate, and
the extension part of the window is coupled to the rear surface of the support plate by an adhesive film.

22. The display device of claim 20, further comprising:
a flexible circuit board attached to the panel extension part; and
a driving chip mounted on the flexible circuit board or the panel extension part.

23. The display device of claim 20, wherein the panel extension part comprises:
a first panel extension part extending from a first side of the panel body part; and
a second panel extension part extending from a second side of the panel body part,
wherein each of the first and second panel extension parts is bent from the panel body part and coupled to the rear surface of the support plate by an adhesive film.

24. An electronic apparatus comprising:
a display device; and
a case comprising a bottom part configured to define an accommodation space, in which the display device is accommodated, and a sidewall,
wherein the display device comprises:
a display module comprising a display panel configured to display an image, and on which a folding area configured to fold with respect to a folding axis and a plurality of non-folding areas adjacent to two opposite sides of the folding area are defined on a plane, and
wherein the display module comprises an upper layer disposed above the display panel, and
an extension part of the upper layer is coupled to the case.

25. The electronic apparatus of claim 24, wherein the display module further comprise:
a lower layer disposed below the display panel.

26. The electronic apparatus of claim 25, wherein the display module is configured to fold so that a display surface of the display panel is exposed.

27. The electronic apparatus of claim 26, wherein the upper layer comprises a body part, and
wherein the extension part extends from the body part.

28. The electronic apparatus of claim 27, wherein the extension part faces a top surface of the sidewall, and
the extension part is coupled to the top surface of the sidewall by an adhesive film.

* * * * *